United States Patent
Orme et al.

(10) Patent No.: US 10,019,353 B2
(45) Date of Patent: Jul. 10, 2018

(54) SYSTEMS AND METHODS FOR REFERENCING DATA ON A STORAGE MEDIUM

(71) Applicant: Longitude Enterprise Flash S.A.R.L., Luxembourg (LU)

(72) Inventors: Evan Orme, Lindon, UT (US); James G. Peterson, San Jose, CA (US); Kevin Vigor, Salt Lake City, UT (US); David Flynn, Sandy, UT (US)

(73) Assignee: Longitude Enterprise Flash S.a.r.l., Luxembourg (LU)

( * ) Notice: Subject to any disclaimer, the term of this patent is extended or adjusted under 35 U.S.C. 154(b) by 762 days.

(21) Appl. No.: 13/925,410

(22) Filed: Jun. 24, 2013

(65) Prior Publication Data

US 2013/0282953 A1    Oct. 24, 2013

Related U.S. Application Data

(63) Continuation-in-part of application No. 13/784,705, filed on Mar. 4, 2013, now Pat. No. 9,495,241.
(Continued)

(51) Int. Cl.
*G06F 12/02* (2006.01)
*G06F 11/10* (2006.01)
(Continued)

(52) U.S. Cl.
CPC .......... *G06F 12/0238* (2013.01); *G06F 3/064* (2013.01); *G06F 3/0608* (2013.01);
(Continued)

(58) Field of Classification Search
None
See application file for complete search history.

(56) References Cited

U.S. PATENT DOCUMENTS

| 4,571,674 A | 2/1986 | Hartung |
| 5,261,068 A | 9/1993 | Gaskins et al. |

(Continued)

FOREIGN PATENT DOCUMENTS

| EP | 1100001 | 5/2001 |
| EP | 1418502 | 5/2004 |

(Continued)

OTHER PUBLICATIONS

Agigatech, Bulletproof Memory for RAID Servers, Part 1, http://agigatech.com/blog/bulletproof-memory-for-raid-servers-part-1/, last visited Feb. 16, 2010.
(Continued)

*Primary Examiner* — Yaima Rigol

(57) ABSTRACT

A storage layer is configured to store data at respective offsets within storage units of a storage device. Physical addresses of the data may be segmented into a first portion identifying the storage unit in which the data is stored, and a second portion that indicates the offset of the data within the identified storage unit. An index of the data offsets (e.g., second portions of the physical addresses) may be persisted on the storage device. The first portion of the address may be associated with logical addresses of the data in a forward index. The forward index may omit the second portion of the physical addresses, which may reduce the memory overhead of the index and/or allow the forward index to reference larger storage devices. Data of a particular logical address may be accessed using the first portion of the physical address maintained in the forward index, and the second portion of the media address stored on the storage device.

12 Claims, 20 Drawing Sheets

Related U.S. Application Data

(60) Provisional application No. 61/663,464, filed on Jun. 22, 2012, provisional application No. 61/606,755, filed on Mar. 5, 2012, provisional application No. 61/606,253, filed on Mar. 2, 2012.

(51) Int. Cl.
  *H04L 12/46* (2006.01)
  *H04L 12/64* (2006.01)
  *H05K 7/14* (2006.01)
  *H04L 12/66* (2006.01)
  *H04L 29/08* (2006.01)
  *G06F 3/06* (2006.01)

(52) U.S. Cl.
  CPC .......... *G06F 3/0679* (2013.01); *G06F 11/108* (2013.01); *G06F 12/0246* (2013.01); *H04L 12/4625* (2013.01); *H04L 12/6418* (2013.01); *H04L 12/66* (2013.01); *H05K 7/1444* (2013.01); *G06F 2003/0694* (2013.01); *G06F 2211/109* (2013.01); *G06F 2212/401* (2013.01); *G06F 2212/7201* (2013.01); *G06F 2212/7208* (2013.01); *H04L 67/1097* (2013.01)

(56) References Cited

U.S. PATENT DOCUMENTS

| | | |
|---|---|---|
| 5,291,496 A | 3/1994 | Andaleon et al. |
| 5,307,497 A | 4/1994 | Feigenbaum et al. |
| 5,313,475 A | 5/1994 | Cromer et al. |
| 5,325,509 A | 6/1994 | Lautzenhaiser |
| 5,337,275 A | 8/1994 | Garner |
| 5,392,427 A | 2/1995 | Barrett et al. |
| 5,404,485 A | 4/1995 | Ban |
| 5,438,671 A | 8/1995 | Miles |
| 5,469,555 A | 11/1995 | Ghosh et al. |
| 5,499,354 A | 3/1996 | Aschoff et al. |
| 5,504,882 A | 4/1996 | Chai |
| 5,551,003 A | 8/1996 | Mattson et al. |
| 5,559,988 A | 9/1996 | Durante et al. |
| 5,594,883 A | 1/1997 | Pricer |
| 5,596,736 A | 1/1997 | Kerns |
| 5,680,579 A | 10/1997 | Young et al. |
| 5,603,001 A | 11/1997 | Sukegawa et al. |
| 5,701,434 A | 12/1997 | Nakagawa |
| 5,845,313 A | 1/1998 | Estakhri et al. |
| 5,745,792 A | 4/1998 | Jost |
| 5,754,563 A | 5/1998 | White |
| 5,787,486 A | 7/1998 | Chin et al. |
| 5,798,968 A | 8/1998 | Lee et al. |
| 5,809,527 A | 9/1998 | Cooper et al. |
| 5,809,543 A | 9/1998 | Byers et al. |
| 5,845,329 A | 12/1998 | Onishi et al. |
| 5,890,192 A | 3/1999 | Lee et al. |
| 5,907,856 A | 5/1999 | Estakhri et al. |
| 5,961,660 A | 5/1999 | Capps, Jr. et al. |
| 5,924,113 A | 7/1999 | Estakhri et al. |
| 5,930,815 A | 7/1999 | Estakhri et al. |
| 5,933,847 A | 8/1999 | Ogawa |
| 5,953,737 A | 9/1999 | Estakhri et al. |
| 5,960,462 A | 9/1999 | Solomon et al. |
| 5,860,083 A | 12/1999 | Sukegawa |
| 6,000,019 A | 12/1999 | Dykstal et al. |
| 6,128,695 A | 3/2000 | Estakhri et al. |
| 6,069,827 A | 5/2000 | Sinclair |
| 6,073,232 A | 6/2000 | Kroeker et al. |
| 6,101,601 A | 8/2000 | Matthews et al. |
| 6,141,249 A | 10/2000 | Estakhri et al. |
| 6,145,051 A | 11/2000 | Estakhri et al. |
| 6,170,039 B1 | 1/2001 | Kishida |
| 6,170,047 B1 | 1/2001 | Dye |
| 6,172,906 B1 | 1/2001 | Estakhri et al. |
| 6,173,381 B1 | 1/2001 | Dye |
| 6,209,003 B1 | 3/2001 | Mattis et al. |
| 6,223,308 B1 | 4/2001 | Estakhri et al. |
| 6,230,234 B1 | 5/2001 | Estakhri et al. |
| 6,240,040 B1 | 5/2001 | Akaogi et al. |
| 6,330,688 B1 | 12/2001 | Brown |
| 6,356,986 B1 | 3/2002 | Solomon et al. |
| 6,370,631 B1 | 4/2002 | Dye |
| 6,385,710 B1 | 5/2002 | Goldman et al. |
| 6,393,513 B2 | 5/2002 | Estakhri et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,516,380 B2 | 2/2003 | Kenchammana-Hoskote et al. |
| 6,523,102 B1 | 2/2003 | Dye et al. |
| 6,567,889 B1 | 5/2003 | DeKoning et al. |
| 6,587,915 B1 | 7/2003 | Kim |
| 6,601,211 B1 | 7/2003 | Norman |
| 6,611,836 B2 | 8/2003 | Davis et al. |
| 6,622,200 B1 | 9/2003 | Hasbun et al. |
| 6,625,685 B1 | 9/2003 | Cho et al. |
| 6,671,757 B1 | 12/2003 | Multer et al. |
| 6,675,349 B1 | 1/2004 | Chen |
| 6,715,046 B1 | 3/2004 | Shoham et al. |
| 6,725,321 B1 | 4/2004 | Sinclair et al. |
| 6,728,851 B1 | 4/2004 | Estakhri et al. |
| 6,751,155 B2 | 6/2004 | Gorobets |
| 6,754,774 B2 | 6/2004 | Gruner et al. |
| 6,757,800 B1 | 6/2004 | Estakhri et al. |
| 6,775,185 B2 | 8/2004 | Fujisawa et al. |
| 6,779,088 B1 | 8/2004 | Benveniste et al. |
| 6,779,094 B2 | 8/2004 | Selkirk et al. |
| 6,785,785 B2 | 8/2004 | Piccirillo et al. |
| 6,801,979 B1 | 10/2004 | Estakhri |
| 6,804,755 B2 | 10/2004 | Selkirk et al. |
| 6,877,076 B1 | 4/2005 | Cho et al. |
| 6,880,049 B2 | 4/2005 | Gruner et al. |
| 6,883,069 B2 | 4/2005 | Yoshida |
| 6,883,079 B1 | 4/2005 | Priborsky |
| 6,901,499 B2 | 5/2005 | Aasheim et al. |
| 6,910,170 B2 | 6/2005 | Choi et al. |
| 6,912,537 B2 | 6/2005 | Selkirk et al. |
| 6,912,618 B2 | 6/2005 | Estakhri et al. |
| 6,914,853 B2 | 7/2005 | Coulson |
| 6,938,133 B2 | 8/2005 | Johnson et al. |
| 6,973,531 B1 | 12/2005 | Chang et al. |
| 6,977,599 B2 | 12/2005 | Windmer |
| 6,978,342 B1 | 12/2005 | Estakhri et al. |
| 6,981,070 B1 | 12/2005 | Luk et al. |
| 6,996,676 B2 | 2/2006 | Megiddo |
| 7,010,652 B2 | 3/2006 | Piccirillo et al. |
| 7,010,662 B2 | 3/2006 | Aasheim et al. |
| 7,013,376 B2 * | 3/2006 | Hooper, III ........... G06F 3/0616 711/103 |
| 7,013,379 B1 | 3/2006 | Testardi |
| 7,043,599 B1 | 5/2006 | Ware et al. |
| 7,047,366 B1 | 5/2006 | Ezra |
| 7,050,337 B2 | 5/2006 | Iwase et al. |
| 7,058,769 B1 | 6/2006 | Danilak |
| 7,076,723 B2 | 7/2006 | Saliba |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,111,140 B2 | 9/2006 | Estakhri et al. |
| 7,130,956 B2 | 10/2006 | Rao |
| 7,130,957 B2 | 10/2006 | Rao |
| 7,143,228 B2 | 11/2006 | Lida et al. |
| 7,149,947 B1 | 12/2006 | MacLellan et al. |
| 7,167,953 B2 | 1/2007 | Megiddo et al. |
| 7,178,081 B2 | 2/2007 | Lee et al. |
| 7,181,572 B2 | 2/2007 | Walmsley |
| 7,194,577 B2 | 3/2007 | Johnson et al. |
| 7,203,815 B2 | 4/2007 | Haswell |
| 7,197,657 B1 | 5/2007 | Tobias |
| 7,215,580 B2 | 5/2007 | Gorobets |
| 7,219,238 B2 | 5/2007 | Saito et al. |
| 7,234,082 B2 | 6/2007 | Lai et al. |
| 7,243,203 B2 | 7/2007 | Scheuerlein |
| 7,246,179 B2 | 7/2007 | Camara et al. |

(56) References Cited

U.S. PATENT DOCUMENTS

| | | |
|---|---|---|
| 7,280,536 B2 | 10/2007 | Testardi |
| 7,305,520 B2 | 12/2007 | Voigt et al. |
| 7,337,201 B1 | 2/2008 | Yellin et al. |
| 7,340,566 B2 | 3/2008 | Voth et al. |
| 7,356,651 B2 | 4/2008 | Liu et al. |
| 7,360,015 B2 | 4/2008 | Matthews et al. |
| 7,360,037 B2 | 4/2008 | Higaki et al. |
| 7,366,808 B2 | 4/2008 | Kano et al. |
| 7,392,365 B2 | 6/2008 | Selkirk et al. |
| 7,424,593 B2 | 9/2008 | Estakhri et al. |
| 7,437,510 B2 | 10/2008 | Rosenbluth et al. |
| 7,441,090 B2 | 10/2008 | Estakhri et al. |
| 7,444,460 B2 | 10/2008 | Nakanishi et al. |
| 7,447,847 B2 | 11/2008 | Louie et al. |
| 7,450,420 B2 | 11/2008 | Sinclair et al. |
| 7,487,235 B2 | 2/2009 | Andrews et al. |
| 7,487,320 B2 | 2/2009 | Bansai et al. |
| 7,500,000 B2 | 3/2009 | Groves et al. |
| 7,523,249 B1 | 4/2009 | Estakhri et al. |
| 7,529,905 B2 | 5/2009 | Sinclair |
| 7,536,491 B2 | 5/2009 | Kano et al. |
| 7,549,013 B2 | 6/2009 | Estakhri et al. |
| 7,552,271 B2 | 6/2009 | Sinclair et al. |
| 7,580,287 B2 | 8/2009 | Aritome |
| 7,620,769 B2 | 11/2009 | Lee et al. |
| 7,631,162 B2 | 12/2009 | Gorobets |
| 7,640,390 B2 | 12/2009 | Iwamura et al. |
| 7,660,911 B2 | 2/2010 | McDaniel |
| 7,676,628 B1 | 3/2010 | Compton et al. |
| 7,644,239 B2 | 5/2010 | Cenk-Ergan et al. |
| 7,725,628 B1 | 5/2010 | Phan et al. |
| 7,734,643 B1 | 6/2010 | Waterhouse et al. |
| 7,774,392 B2 | 8/2010 | Lin |
| 7,778,961 B2 | 8/2010 | Chang et al. |
| 7,873,803 B2 | 1/2011 | Cheng |
| 7,925,879 B2 | 4/2011 | Yasaki et al. |
| 7,934,072 B2 | 4/2011 | Hobbet et al. |
| 7,970,806 B2 | 6/2011 | Park et al. |
| 7,970,919 B1 | 6/2011 | Duran |
| 8,028,120 B2 | 9/2011 | Mo et al. |
| 8,078,794 B2 | 12/2011 | Lee et al. |
| 8,112,574 B2 | 2/2012 | Lee et al. |
| 8,533,391 B2 | 9/2013 | Song et al. |
| 8,572,310 B2 | 10/2013 | Oh et al. |
| 8,694,722 B2 | 4/2014 | Gorobets et al. |
| 8,745,011 B2 | 6/2014 | Kishi |
| 8,838,875 B2 | 9/2014 | Park |
| 9,152,556 B2 | 10/2015 | Olbrich et al. |
| 9,286,198 B2 | 3/2016 | Bennett |
| 2001/0008007 A1 | 7/2001 | Halligan et al. |
| 2002/0069318 A1 | 6/2002 | Chow et al. |
| 2002/0194451 A1 | 12/2002 | Mukaida et al. |
| 2003/0061296 A1 | 3/2003 | Craddock et al. |
| 2003/0093741 A1 | 5/2003 | Argon et al. |
| 2003/0198084 A1 | 10/2003 | Fujisawa et al. |
| 2004/0093463 A1 | 5/2004 | Shang |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0055497 A1 | 3/2005 | Estakhri et al. |
| 2005/0076107 A1 | 4/2005 | Goud et al. |
| 2005/0132259 A1 | 6/2005 | Emmot et al. |
| 2005/0144361 A1 | 6/2005 | Gonzalez et al. |
| 2005/0149618 A1 | 7/2005 | Cheng |
| 2005/0149819 A1 | 7/2005 | Hwang |
| 2005/0177672 A1 | 8/2005 | Rao |
| 2005/0177687 A1 | 8/2005 | Rao |
| 2005/0193166 A1 | 9/2005 | Johnson et al. |
| 2005/0229090 A1 | 10/2005 | Shen et al. |
| 2005/0240713 A1 | 10/2005 | Wu et al. |
| 2005/0246510 A1 | 11/2005 | Retnammana et al. |
| 2005/0257213 A1 | 11/2005 | Chu et al. |
| 2005/0276092 A1 | 12/2005 | Hansen et al. |
| 2006/0004955 A1 | 1/2006 | Ware et al. |
| 2006/0026339 A1 | 2/2006 | Rostampour |
| 2006/0059326 A1 | 3/2006 | Aasheim et al. |
| 2006/0075057 A1 | 4/2006 | Gildea et al. |
| 2006/0090048 A1 | 4/2006 | Okumoto et al. |
| 2006/0106968 A1 | 5/2006 | Wooi Teoh |
| 2006/0143396 A1 | 6/2006 | Cabot |
| 2006/0149902 A1 | 7/2006 | Yun et al. |
| 2006/0152981 A1 | 7/2006 | Ryu |
| 2006/0224849 A1 | 10/2006 | Islam et al. |
| 2006/0248387 A1 | 11/2006 | Nicholson et al. |
| 2007/0016699 A1 | 1/2007 | Minami |
| 2007/0050571 A1 | 3/2007 | Nakamura et al. |
| 2007/0067326 A1 | 3/2007 | Morris et al. |
| 2007/0118676 A1 | 5/2007 | Kano et al. |
| 2007/0124474 A1 | 5/2007 | Margulis |
| 2007/0124540 A1 | 5/2007 | van Riel |
| 2007/0150689 A1 | 6/2007 | Pandit et al. |
| 2007/0162830 A1 | 7/2007 | Stek et al. |
| 2007/0198770 A1 | 8/2007 | Horii et al. |
| 2007/0204128 A1* | 8/2007 | Lee ............... G06F 12/0246 711/173 |
| 2007/0204197 A1 | 8/2007 | Yokokawa |
| 2007/0233455 A1 | 10/2007 | Zimmer et al. |
| 2007/0233937 A1 | 10/2007 | Coulson et al. |
| 2007/0245217 A1 | 10/2007 | Valle |
| 2007/0250660 A1 | 10/2007 | Gill et al. |
| 2007/0271468 A1 | 11/2007 | McKenny et al. |
| 2007/0271572 A1 | 11/2007 | Gupta et al. |
| 2007/0274150 A1 | 11/2007 | Gorobets |
| 2007/0276897 A1 | 11/2007 | Tameshige et al. |
| 2007/0300008 A1 | 12/2007 | Rogers et al. |
| 2008/0005748 A1 | 1/2008 | Matthew et al. |
| 2008/0010395 A1 | 1/2008 | Mylly et al. |
| 2008/0043769 A1 | 2/2008 | Hirai |
| 2008/0059752 A1 | 3/2008 | Serizawa |
| 2008/0091876 A1 | 4/2008 | Fujibayashi et al. |
| 2008/0098159 A1 | 4/2008 | Song et al. |
| 2008/0109090 A1 | 5/2008 | Esmaili et al. |
| 2008/0114962 A1 | 5/2008 | Holt |
| 2008/0120469 A1 | 5/2008 | Kornegay |
| 2008/0123211 A1 | 5/2008 | Chang et al. |
| 2008/0126700 A1 | 5/2008 | El-Batal et al. |
| 2008/0126852 A1 | 5/2008 | Brandyberry et al. |
| 2008/0133963 A1 | 6/2008 | Katano et al. |
| 2008/0137658 A1 | 6/2008 | Wang |
| 2008/0140819 A1 | 6/2008 | Bailey et al. |
| 2008/0183965 A1 | 7/2008 | Shiga et al. |
| 2008/0201535 A1 | 8/2008 | Hara |
| 2008/0205286 A1 | 8/2008 | Li et al. |
| 2008/0229046 A1 | 9/2008 | Raciborski |
| 2008/0235443 A1 | 9/2008 | Chow et al. |
| 2008/0276040 A1 | 11/2008 | Moritoki |
| 2008/0313364 A1 | 12/2008 | Flynn et al. |
| 2009/0043952 A1 | 2/2009 | Estakhri et al. |
| 2009/0070541 A1 | 3/2009 | Yochai |
| 2009/0083478 A1 | 3/2009 | Kunimatsu et al. |
| 2009/0083485 A1 | 3/2009 | Cheng |
| 2009/0089518 A1 | 4/2009 | Hobbet et al. |
| 2009/0125650 A1 | 5/2009 | Sebire |
| 2009/0144496 A1 | 6/2009 | Kawaguchi |
| 2009/0157956 A1 | 6/2009 | Kano |
| 2009/0204750 A1 | 8/2009 | Estakhri et al. |
| 2009/0228637 A1 | 9/2009 | Moon |
| 2009/0235017 A1 | 9/2009 | Estakhri et al. |
| 2009/0276654 A1 | 11/2009 | Butterworth |
| 2009/0294847 A1 | 11/2009 | Maruyama et al. |
| 2009/0300277 A1 | 12/2009 | Jeddeloh |
| 2009/0313453 A1 | 12/2009 | Stefanus et al. |
| 2009/0327602 A1 | 12/2009 | Moore et al. |
| 2009/0327804 A1 | 12/2009 | Moshayedi |
| 2010/0017441 A1 | 1/2010 | Todd |
| 2010/0017556 A1 | 1/2010 | Chin |
| 2010/0023674 A1 | 1/2010 | Aviles |
| 2010/0023676 A1 | 1/2010 | Moon |
| 2010/0023682 A1* | 1/2010 | Lee ............... G06F 12/0246 711/103 |
| 2010/0030946 A1 | 2/2010 | Kano et al. |

(56) References Cited

U.S. PATENT DOCUMENTS

| | | | | |
|---|---|---|---|---|
| 2010/0077133 A1* | 3/2010 | Jeon | ....................... | G11C 16/26 711/103 |
| 2010/0077194 A1 | 3/2010 | Zhao et al. | | |
| 2010/0268869 A1* | 10/2010 | Roh | .................... | G06F 12/0246 711/103 |
| 2012/0124315 A1* | 5/2012 | Wang | .................. | G06F 12/0246 711/165 |

FOREIGN PATENT DOCUMENTS

| | | |
|---|---|---|
| EP | 1814039 | 3/2009 |
| GB | 0123416 | 9/2001 |
| JP | 4242848 | 8/1992 |
| JP | 200259525 | 9/2000 |
| JP | 2009122850 | 6/2009 |
| WO | WO1994/019746 | 9/1994 |
| WO | WO1995/018407 | 7/1995 |
| WO | WO1996/012225 | 4/1996 |
| WO | WO2001/31512 | 5/2001 |
| WO | WO2001/01365 | 1/2002 |
| WO | WO2008/073421 | 6/2008 |

OTHER PUBLICATIONS

Anonymous, "Method for Fault Tolerance in Nonvolatile Storage", http://ip.com, IP.com No. IPCOM000042269D, 2005.
Ari, "Performance Boosting and Workload Isolation in Storage Area Networks with SanCache," Hewlett Packard Laboratories, Proceedings of the 23rd IEEE / 14th SA Goddard Conference on Mass Storage Systems and Technologies (MSST 2006), May 2006, pp. 263-227.
Bandulet "Object-Based Storage Devices," Jul. 2007 http://developers.sun.com/solaris/articles/osd.htme, visited Dec. 1, 2011.
Bitmicro, "BiTMICRO Introduces E-Disk PMC Flash Disk Module at Military & Aerospace Electronics East 2004," http://www.bitmicro.com/press.sub, published May 18, 2004, visited Mar. 8, 2011.
Casey, "Disk I/O Performance Scaling: the File Cashing Solution," Solid Data Systems, Inc., Paper #528, Mar. 2011, pp. 1-8.
Casey, "San Cache: SSD in the San," Storage Inc., http://www.solidata.com/resourses/pdf/storageing.pdf, 2000, visited May 20, 2011.
Casey, "Solid State File-Caching for Performance and Scalability," SolidData Quarter 1 2000, http://www/storagesearch. com/3dram.html, visited May 20, 2011.
Data Direct Networks, "White Paper: S2A9550 Overview," www.//datadirectnet. com, 2007.
Feresten, "Netapp Thin Provisioning: Better for Business, Netapp White Paper," WP-7017-0307, http://media.netapp.com/documents/wp-thin-provisioning.pdf, Mar. 2007, visited Jun. 19, 2012.
Gill, "WOW: Wise Ordering for Writes—Combining Spatial and Temporal Locality in Non-Volatile Caches," IBM, Fast "05: 4th USENIX Conference on File and Storage Technologies, 2005.
Intel, "Non-Volatile Memory Host Controller Interface (NVMHCI) 1.0," Apr. 14, 2008.
Johnson, "An Introduction to Block Device Drivers," Jan. 1, 1995.
Kawaguchi, "A Flash-Memory Based File System," TCON'95 Proceedings of the USENIX 1995 Technical Conference Proceedings, p. 13.
Leventhal, "Flash Storage Memory," Communications of the ACM, vol. 51, No. 7, pp. 47-51, Jul. 2008.
Mesnier, "Object-Based Storage," IEEE Communications Magazine, Aug. 2003, pp. 84-90.
Micron Technology, Inc., "NAND Flash 101: An Introduction to ND Flash and How to Design It in to Your Next Product (TN-29-19)," http://www.micron.com/~/media/Documents/Products/Technical %20Note/ND%20Flash/145tn2919_nd_101.pdf; 2006, visited May 10, 2010.
Micron, "TN-29-08: Technical Note, Hamming Codes for ND Flash Memory Devices," Mar. 10, 2010.
Micron, "TN-29-17: NAND Flash Design and Use Considerations," Mar. 10, 2010.
Microsoft, "How NTFS Works," Apr. 9, 2010.
Morgenstern, David, "Is There a Flash Memory RAID in your Future?", http://www.eweek.com—eWeek, Ziff Davis Enterprise Holdings Inc., Nov. 8, 2006, visited Mar. 18, 2010.
Novell, "File System Primer", http://wiki.novell.com/index.php/File_System_Primer, 2006, visited Oct. 18, 2006.
PIVOT3, "RAIGE Cluster: Technology Overview," White Paper, www.pivot3.com, Jun. 2007.
Plank, "A Tutorial on Reed-Solomon Coding for Fault Tolerance in RAID-like System," Department of Computer Science, University of Tennessee, pp. 995-1012, Sep. 1997.
Rosenblum, "The Design and Implementation of a Log-Structured File System," ACM Transactions on Computer Systems, vol. 10 Issue 1, Feb. 1992.
Samsung Electronics, "Introduction to Samsung's Linux Flash File System—RFS Application Note", Version 1.0, Nov. 2006.
Seagate Research, "The Advantages of Object-Based Storage-Secure, Scalable, Dynamic Storage Devices," Technology Paper TP-536, Apr. 2005.
Singer, Dan, "Implementing MLC ND Flash for Cost-Effective, High Capacity Memory," M-Systems, White Paper, 91-SR014-02-8L, Rev. 1.1, Sep. 2003.
Solidata, "Best Practices Guide, Sybase: Maximizing Performance through Solid State File-Caching," http://soliddate.com/resources/pdf/bp-sybase.pdf. May 2000, cited May 18, 2011.
Spansion, "Data Management Software (DMS) for AMD Simultaneous Read/Write Flash Memory Devices", published Jul. 7, 2003.
Van Hensbergen, "Dynamic Policy Disk Caching for Storage Networking," IBM Research Division, RC24123 (W0611-189), Nov. 2006.
Wang, "OBFS: A File System for Object-based Storage Devices", 21st IEE/12th SA Goddard Conference on Mass Storage Systems and Technologies, Apr. 2004.
Woodhouse, "JFFS: The Journaling Flash File System," Ottawa Linux Symposium, http://sources.redhat.com/jffs2/jffs2.pdf, Jul. 2001.
Wu, "eNVy: A Non-Volatile, Main Memory Storage System," ACM 0-89791-660-3/94/0010, ASPLOS-VI Proceedings of the sixth international conference on Architectural support for programming languages and operating systems, pp. 86-97, 1994.
Yerrick, "Block Device," http://www.pineight.com/ds/block, last visited Mar. 1, 2010.

* cited by examiner

SYSTEMS AND METHODS FOR REFERENCING DATA ON A STORAGE MEDIUM

CROSS-REFERENCE TO RELATED APPLICATIONS

This application is a continuation-in-part of, and claims priority to, U.S. patent application Ser. No. 13/784,705, entitled, "Systems and Methods for Adaptive Data Storage," filed Mar. 4, 2013, which claims priority to U.S. Provisional Patent Application Ser. No. 61/606,253, entitled, "Adaptive Data Arrangement," filed Mar. 2, 2012 for David Flynn et al. and to U.S. Provisional Patent Application Ser. No. 61/606,755, entitled, "Adaptive Data Arrangement," filed Mar. 5, 2012, for David Flynn et al.; this application also claims priority to U.S. Provisional Patent Application Ser. No. 61/663,464, entitled, "Systems and Methods for Referencing Data on a Non-Volatile Storage Medium," filed Jun. 22, 2012 for David Flynn et al., each of which is hereby incorporated by reference.

TECHNICAL FIELD

This disclosure relates to data storage and, in particular, to systems and methods for efficiently referencing data stored on a non-volatile storage medium.

BACKGROUND

A storage system may map logical addresses to storage locations of a storage device. Physical addressing metadata used to reference the storage locations may consume significant memory resources. Moreover, the size of the physical addressing metadata may limit the size of the storage resources the system is capable of referencing.

SUMMARY

Disclosed herein are embodiments of a method for referencing data on a storage medium. The method may comprise arranging a plurality of data segments for storage at respective offsets within a storage location of a solid-state storage medium, mapping front-end addresses of the data segments to an address of the storage location in a first index, and generating a second index configured for storage on the solid-state storage medium, wherein the second index is configured to associate the front-end addresses of the data segments with respective offsets of the data segments within the storage location. In some embodiments, the method further includes compressing one or more of the data segments for storage on the solid-state storage medium such that a compressed size of the compressed data segments differs from an uncompressed size of the data segments, wherein the offsets of the data segments within the storage location are based on the compressed size of the one or more data segments.

The disclosed method may further comprise storing the second index on the storage medium. The second index may be stored on the storage location that comprises the plurality of data segments. The offsets may be omitted from the first index, which may reduce the overhead of the first index and/or allow the first index to reference a larger storage address space. The storage address of a data segment associated with a particular front-end address may be determined by use of a storage location address mapped to the particular front-end address in the first index and a data segment offset associated with the particular front-end address of the second index stored on the storage location. Accessing a requested data segment of a specified front-end address may include accessing a physical address of a storage location mapped to the specified front-end address in the first index, and reading the second index stored on the storage location to determine an offset of the requested data segment within the storage location.

Disclosed herein are embodiments of an apparatus for referencing data stored on a storage medium. The apparatus may include a storage layer configured to store data packets within storage units of a non-volatile storage medium, wherein the storage units are configured to store a plurality of data packets, a data layout module configured to determine relative locations of the stored data packets within the storage units, and an offset index module configured to generate offset indexes for the storage units based on the determined relative locations of the data packets stored within the storage units, wherein the offset index of a storage unit is configured to associate logical identifiers of data packets stored within the storage unit with the determined relative locations of the data packets within the storage unit.

In some embodiments, the disclosed apparatus further includes a compression module configured to compress data of one or more of the data packets, such that a compressed size of the data differs from an uncompressed size of the data, wherein the offset index module is configured to determine the offsets of the data packets based on the compressed size of the data. The apparatus may further comprise a translation module which may be used to associate logical identifiers with media addresses of storage units comprising data packets corresponding to the logical identifiers, wherein the storage layer is configured to access a data packet corresponding to a logical identifier by use of a media address of a storage unit associated with the logical identifier by the translation module, and an offset index indicating a relative location of the data packet within the storage unit, wherein the offset index is stored at a pre-determined location within the storage unit.

The storage layer may be configured to store the offset indexes of the storage units at pre-determined locations within the storage units. The storage layer may be further configured to store each offset index within the storage unit that comprises data packets indexed by the offset index.

The storage medium may comprise a solid-state storage array comprising a plurality of columns, each column comprising a respective solid-state storage element, and wherein each of the storage units comprises physical storage units on two or more columns of the solid-state storage array. The solid-state storage array may comprise a plurality of columns, each column comprising a respective solid-state storage element. The offset indexes may indicate a relative location of a data packet within a column of the solid-state storage array. In some embodiments, the storage medium is a solid-state storage array comprising a plurality of independent channels, each channel comprising a plurality of solid-state storage elements, and wherein the offset indexes indicate relative locations of data packets within respective independent channels.

Disclosed herein are further embodiments of a method for referencing data stored on a storage medium, by: segmenting physical addresses of data stored on a solid-state storage array into respective first portions and second portions, wherein the first portions of the physical addresses correspond to storage unit addresses, and wherein the second portions correspond to data offsets within respective storage units, mapping logical addresses of the data to respective first portions of the physical addresses, and storing the second portions of the physical addresses within respective storage units. The method may further comprise compressing the data for storage on the solid-state storage device, wherein the data offsets within respective storage units are based on a compressed size of the data.

Data corresponding to a logical address may be accessed by combining a first portion of the physical address mapped to the logical address with a second portion of the physical address stored on a storage unit corresponding to the first portion of the physical address. In some embodiments, each storage unit comprises a plurality of storage units corresponding to respective solid-state storage elements. Alternatively, or in addition, the storage unit may comprise a page on a solid-state storage element, and the second portions of the physical addresses may correspond to a data offsets within the pages.

DETAILED DESCRIPTION

Figure 1A:
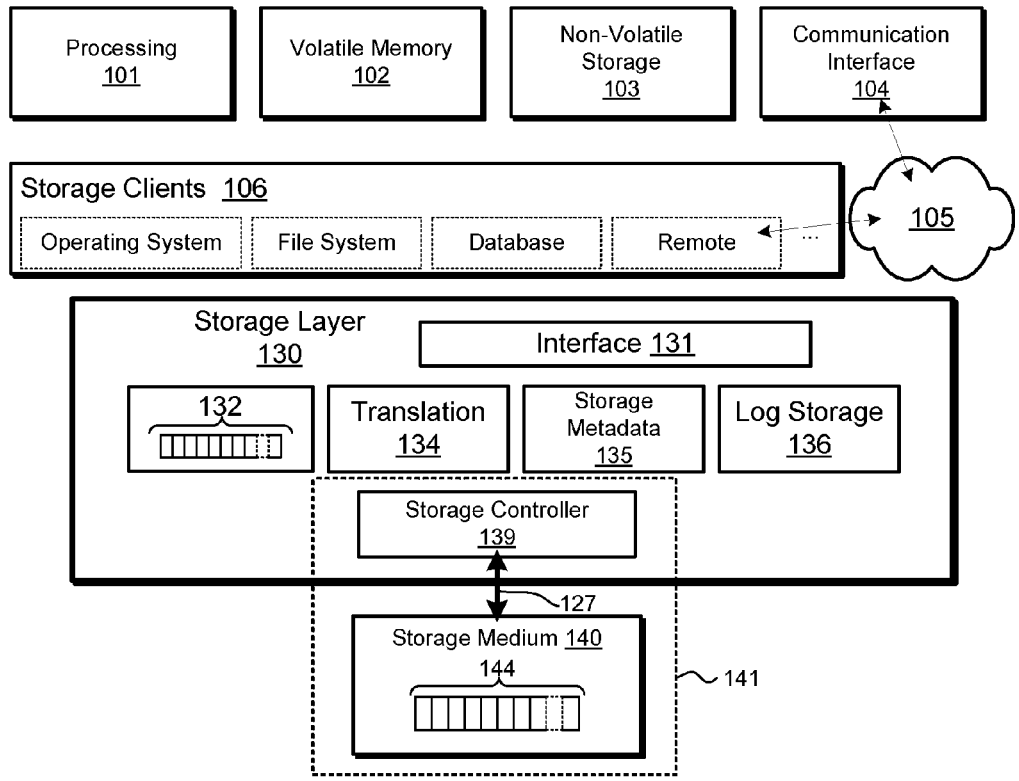
FIG. 1A is a block diagram of one embodiment of a computing system comprising a storage layer.

FIG. 1A is a block diagram of one embodiment of a computing system 100 comprising a storage layer 130 configured to provide storage services to one or more storage clients 106. The computing system 100 may comprise any suitable computing device, including, but not limited to: a server, desktop, laptop, embedded system, mobile device, and/or the like. In some embodiments, computing system 100 may include multiple computing devices, such as a cluster of server computing devices. The computing system 100 may comprise processing resources 101, volatile memory resources 102 (e.g., random access memory (RAM)), non-volatile storage resources 103, and a communication interface 104. The processing resources 101 may include, but are not limited to, general purpose central processing units (CPUs), application-specific integrated circuits (ASICs), programmable logic elements, such as field programmable gate arrays (FPGAs), programmable logic arrays (PLGs), and the like. The non-volatile storage 103 may comprise a non-transitory machine-readable storage medium, such as a magnetic hard disk, solid-state storage medium, optical storage medium, and/or the like. The communication interface 104 may be configured to communicatively couple the computing system 100 to a network 105. The network 105 may comprise any suitable communication network including, but not limited to: a Transmission Control Protocol/Internet Protocol (TCP/IP) network, a Local Area Network (LAN), a Wide Area Network (WAN), a Virtual Private Network (VPN), a Storage Area Network (SAN), a Public Switched Telephone Network (PSTN), the Internet, and/or the like.

The computing system 100 may comprise a storage layer 130, which may be configured to provide storage services to one or more storage clients 106. The storage clients 106 may include, but are not limited to: operating systems (including bare metal operating systems, guest operating systems, virtual machines, virtualization environments, and the like), file systems, database systems, remote storage clients (e.g., storage clients communicatively coupled to the computing system 100 and/or storage layer 130 through the network 105), and/or the like.

The storage layer 130 (and/or modules thereof) may be implemented in software, hardware and/or a combination thereof. In some embodiments, portions of the storage layer 130 are embodied as executable instructions, such as computer program code, which may be stored on a persistent, non-transitory storage medium, such as the non-volatile storage resources 103. The instructions and/or computer program code may be configured for execution by the processing resources 101. Alternatively, or in addition, portions of the storage layer 130 may be embodied as machine components, such as general and/or application-specific components, programmable hardware, FPGAs, ASICs, hardware controllers, storage controllers, and/or the like.

The storage layer 130 may be configured to perform storage operations on a storage medium 140. The storage medium 140 may comprise any storage medium capable of storing data persistently. As used herein, "persistent" data storage refers to storing information on a persistent, non-volatile storage medium. The storage medium 140 may include non-volatile storage media such as solid-state storage media in one or more solid-state storage devices or drives (SSD), hard disk drives (e.g., Integrated Drive Electronics (IDE) drives, Small Computer System Interface (SCSI) drives, Serial Attached SCSI (SAS) drives, Serial AT Attachment (SATA) drives, etc.), tape drives, writable optical drives (e.g., CD drives, DVD drives, Blu-ray drives, etc.), and/or the like.

In some embodiments, the storage medium 140 comprises non-volatile solid-state memory, which may include, but is not limited to, NAND flash memory, NOR flash memory, nano RAM (NRAM), magneto-resistive RAM (MRAM), phase change RAM (PRAM), Racetrack memory, Memristor memory, nanocrystal wire-based memory, silicon-oxide based sub-10 nanometer process memory, graphene memory, Silicon-Oxide-Nitride-Oxide-Silicon (SONOS), Resistive random-access memory (RRAM), programmable metallization cell (PMC), conductive-bridging RAM (CBRAM), and/or the like. Although particular embodiments of the storage medium 140 are disclosed herein, the teachings of this disclosure could be applied to any suitable form of memory including both non-volatile and volatile forms. Accordingly, although particular embodiments of the storage layer 130 are disclosed in the context of non-volatile, solid-state storage devices 140, the storage layer 130 may be used with other storage devices and/or storage media.

In some embodiments, the storage device 130 includes volatile memory, which may include, but is not limited to RAM, dynamic RAM (DRAM), static RAM (SRAM), synchronous dynamic RAM (SDRAM), etc. The storage medium 140 may correspond to memory of the processing resources 101, such as a CPU cache (e.g., L1, L2, L3 cache, etc.), graphics memory, and/or the like. In some embodiments, the storage medium 140 is communicatively coupled to the storage layer 130 by use of an interconnect 127. The interconnect 127 may include, but is not limited to peripheral component interconnect (PCI), PCI express (PCI-e), serial advanced technology attachment (serial ATA or SATA), parallel ATA (PATA), small computer system interface (SCSI), IEEE 1394 (FireWire), Fiber Channel, universal serial bus (USB), and/or the like. Alternatively, the storage medium 140 may be a remote storage device that is communicatively coupled to the storage layer 130 through the network 105 (and/or other communication interface, such as a Storage Area Network (SAN), a Virtual Storage Area Network (VSAN), or the like). The interconnect 127 may, therefore, comprise a remote bus, such as a PCE-e bus, a network connection (e.g., Infiniband), a storage network, Fibre Channel Protocol (FCP) network, HyperSCSI, and/or the like.

The storage layer 130 may be configured to manage storage operations on the storage medium 140 by use of, inter alia, a storage controller 139. The storage controller 139 may comprise software and/or hardware components including, but not limited to: one or more drivers and/or other software modules operating on the computing system 100, such as storage drivers, I/O drivers, filter drivers, and/or the like, hardware components, such as hardware controllers, communication interfaces, and/or the like, and so on. The storage medium 140 may be embodied on a storage device 141. Portions of the storage layer 139 (e.g., storage controller 139) may be implemented as hardware and/or software components (e.g., firmware) of the storage device 141.

The storage controller 139 may be configured to implement storage operations at particular storage locations of the storage medium 140. As used herein, a storage location refers to unit of storage of a storage resource (e.g., a storage medium and/or device) that is capable of storing data persistently; storage locations may include, but are not limited to: pages, groups of pages (e.g., logical pages and/or offsets within a logical page), storage divisions (e.g., physical erase blocks, logical erase blocks, etc.), sectors, locations on a magnetic disk, battery-backed memory locations, and/or the like. The storage locations may be addressable within a storage address space 144 of the storage medium 140. Storage addresses may correspond to physical addresses, media addresses, back-end addresses, address offsets, and/or the like. Storage addresses may correspond to any suitable storage address space 144, storage addressing scheme and/or arrangement of storage locations.

The storage layer 130 may comprise an interface 131 through which storage clients 106 may access storage services provided by the storage layer. The storage interface 131 may include one or more of: a block device interface, a virtualized storage interface, an object storage interface, a database storage interface, and/or other suitable interface and/or Application Programming Interface (API).

The storage layer 130 may provide for referencing storage resources through a front-end interface. As used herein, a front-end interface refers to the identifiers used by the storage clients 106 to reference storage resources and/or services of the storage layer 130. A front-end interface may correspond to a front-end address space 132 that comprises a set, range, and/or extent of front-end addresses or identifiers. As used herein, a front-end address refers to an identifier used to reference data and/or storage resources; front-end addresses may include, but are not limited to: names (e.g., file names, distinguished names, etc.), data identifiers, logical identifiers (LIDs), logical addresses, logical block addresses (LBAs), logical unit number (LUN) addresses, virtual storage addresses, storage addresses, physical addresses, media addresses, and/or the like. In some embodiments, the front-end address space 132 comprises a logical address space, comprising a plurality of logical identifiers, LBAs, and/or the like.

The translation module 134 may be configured to map front-end identifiers of the front-end address space 132 to storage resources (e.g., data stored within the storage address space 144 of the storage medium 140). The front-end address space 132 may be independent of the back-end storage resources (e.g., the storage medium 140); accordingly, there may be no set or pre-determined mappings between front-end addresses of the front-end address space 132 and the storage addresses of the storage address space 144 of the storage medium 140. In some embodiments, the front-end address space 132 is sparse, thinly provisioned, and/or over-provisioned, such that the size of the front-end address space 132 differs from the storage address space 144 of the storage medium 140.

The storage layer 130 may be configured to maintain storage metadata 135 pertaining to storage operations performed on the storage medium 140. The storage metadata 135 may include, but is not limited to: a forward index comprising any-to-any mappings between front-end identifiers of the front-end address space 132 and storage addresses within the storage address space 144 of the storage medium 140, a reverse index pertaining to the contents of the storage locations of the storage medium 140, one or more validity bitmaps, reliability testing and/or status metadata, status information (e.g., error rate, retirement status, and so on), and/or the like. Portions of the storage metadata 135 may be maintained within the volatile memory resources 102 of the computing system 100. Alternatively, or in addition, portions of the storage metadata 135 may be stored on non-volatile storage resources 103 and/or the storage medium 140.

Figure 1B:
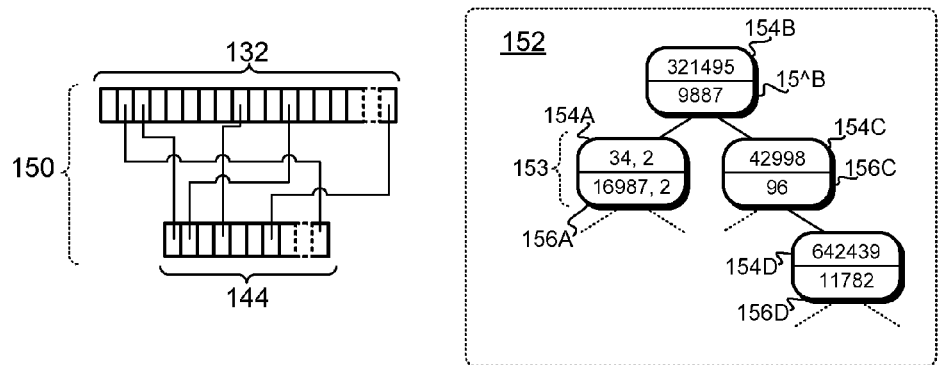
FIG. 1B depicts embodiments of any-to-any mappings.

FIG. 1B depicts one embodiment of any-to-any mappings 150 between front-end identifiers of the front-end address space 132 and back-end identifiers (e.g., storage addresses) within the storage address space 144. The any-to-any mappings 150 may be maintained in one or more data structures of the storage metadata 135. As illustrated in FIG. 1B, the translation module 134 may be configured to map any front-end address to any back-end storage location. As further illustrated, the front-end address space 132 may be sized differently than the underlying storage address space 144. In the FIG. 1B embodiment, the front-end address space 132 may be thinly provisioned, and, as such, may comprise a larger range of front-end identifiers than the range of storage addresses in the storage address space 144.

The storage layer 130 may be configured to maintain the any-to-any mappings in a forward map 152. The forward map 152 may comprise any suitable data structure, including, but not limited to: an index, a map, a hash map, a hash table, an extended-range tree, a b-tree, and/or the like. The forward map 152 may comprise entries 153 corresponding to front-end identifiers that have been allocated for use to reference data stored on the storage medium 140. The entries 153 of the forward map 152 may associate front-end identifiers 154A-D with respective storage addresses 156A-D within the storage address space 144. The forward map 152 may be sparsely populated, and as such, may omit entries corresponding to front-end identifiers that are not currently allocated by a storage client 106 and/or are not currently in use to reference valid data stored on the storage medium 140. In some embodiments, the forward map 152 comprises a range-encoded data structure, such that one or more of the entries 153 may correspond to a plurality of front-end identifiers (e.g., a range, extent, and/or set of front-end identifiers). In the FIG. 1B embodiment, the forward map 152 includes an entry 153 corresponding to a range of front-end identifiers 154A mapped to a corresponding range of storage addresses 156A. The entries 153 may be indexed by front-end identifiers. In the FIG. 1B embodiment, the entries 153 are arranged into a tree data structure by respective links. The disclosure is not limited in this regard, however, and could be adapted to use any suitable data structure and/or indexing mechanism.

Figure 1C:
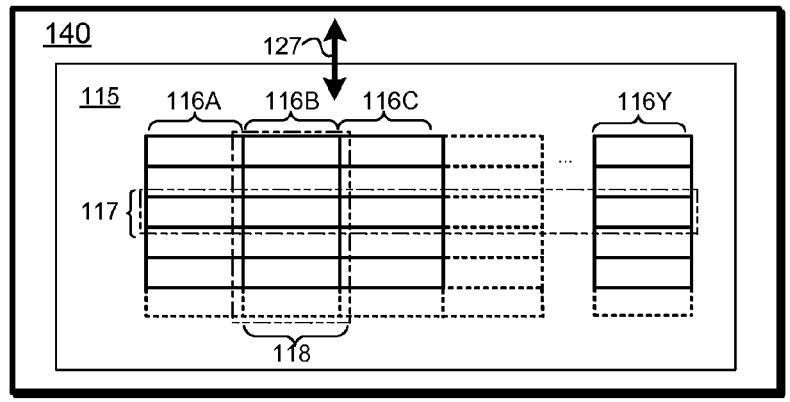
FIG. 1C depicts one embodiment of a solid-state storage array.

Referring to FIG. 1C, in some embodiments, the solid-state storage medium 140 may comprise a solid-state storage array 115 comprising a plurality of solid-state storage elements 116A-Y. As used herein, a solid-state storage array (or array) 115 refers to a set of two or more independent columns 118. A column 118 may comprise one or more solid-state storage elements 116A-Y that are communicatively coupled to the storage layer 130 in parallel using, inter alia, the interconnect 127. Rows 117 of the array 115 may comprise physical storage units of the respective columns 118 (solid-state storage elements 116A-Y). As used herein, a solid-state storage element 116A-Y includes, but is not limited to: solid-state storage resources embodied as: a package, chip, die, plane, printed circuit board, and/or the like. The solid-state storage elements 116A-Y comprising the array 115 may be capable of independent operation. Accordingly, a first one of the solid-state storage elements 116A may be capable of performing a first storage operation while a second solid-state storage element 116B performs a different storage operation. For example, the solid-state storage element 116A may be configured to read data at a first physical address, while another solid-state storage element 116B reads data at a different physical address.

A solid-state storage array 115 may also be referred to as a logical storage element (LSE). As disclosed in further detail herein, the solid-state storage array 115 may comprise logical storage units (rows 117). As used herein, a "logical storage unit" or row 117 refers to a logical construct combining two or more physical storage units, each physical storage unit on a respective column 118 of the array 115. A logical erase block refers to a set of two or more physical erase blocks, a logical page refers to a set of two or more pages, and so on. In some embodiments, a logical erase block may comprise erase blocks within respective logical storage elements 115 and/or banks. Alternatively, a logical erase block may comprise erase blocks within a plurality of different arrays 115 and/or may span multiple banks of solid-state storage elements.

Referring back to FIG. 1A, the storage layer 130 may further comprise a log storage module 136 configured to store data on the storage medium 140 in log structured storage configuration (e.g., in a storage log). As used herein, a "storage log" or "log structure" refers to an ordered arrangement of data within the storage address space 144 of the storage medium 140. In the FIG. 1A embodiment, the log storage module 136 may be configured to append data sequentially within the storage address space 144 of the storage medium 140.

Figure 1D:
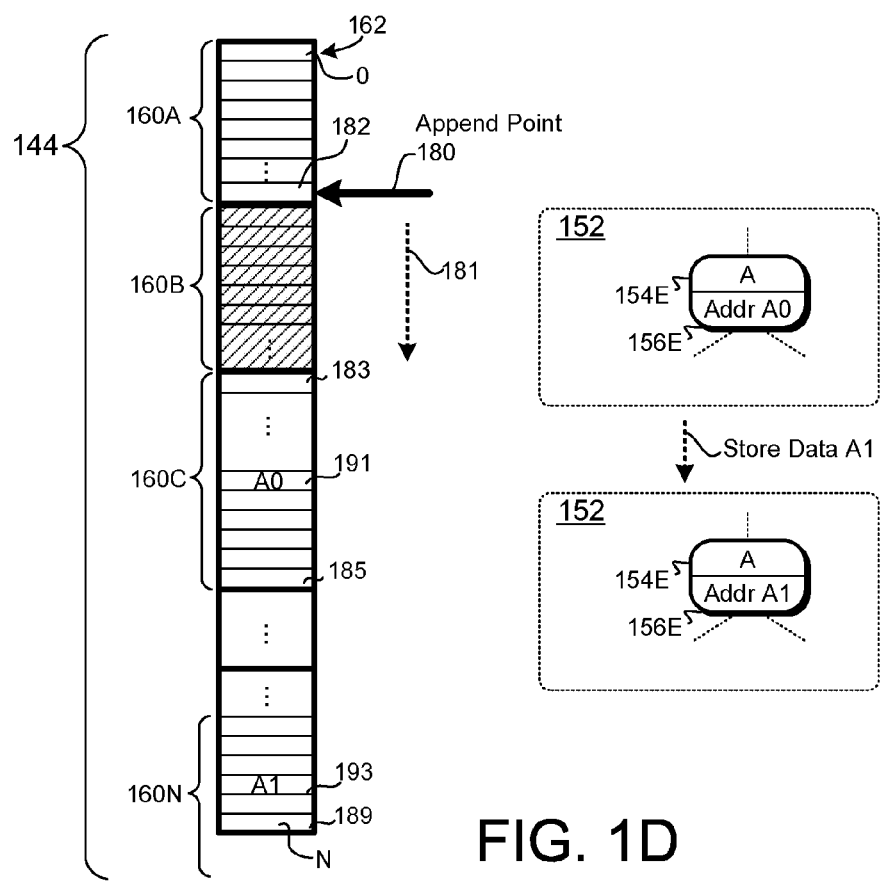
FIG. 1D depicts one embodiment of a storage log.

FIG. 1D depicts one embodiment of the storage address space 144 of the storage medium 140. The storage address space 144 comprises a plurality of storage divisions (e.g., erase blocks, logical erase blocks, or the like), each of which can be initialized (e.g., erased) for use in storing data. The storage divisions 160A-N may comprise respective storage locations, which may correspond to pages, logical pages and/or the like. The storage locations may be assigned respective storage addresses (e.g., storage address 0 to storage address N).

The log storage module 136 may be configured to store data sequentially at an append point 180 within the physical address space 144. Data may be appended at the append point 180 and, when the storage location 182 is filled, the append point 180 may advance 181 to a next available storage location. As used herein, an "available" logical page refers to a logical page that has been initialized (e.g., erased) and has not yet been programmed. Some types of storage media can only be reliably programmed once after erasure. Accordingly, an available storage location may refer to a storage division 160A-N that is in an initialized (or erased) state. Storage divisions 160A-N may be reclaimed for use in a storage recovery process, which may comprise relocating valid data (if any) on the storage division 160A-N that is being reclaimed to other storage division(s) 160A-N and erasing the storage division 160A-N.

In the FIG. 1C embodiment, the logical erase block 160B may be unavailable for storage due to, inter alia, not being in an erased state (e.g., comprising valid data), being out-of-service due to high error rates or the like, and so on. Therefore, after filling the storage location 182, the log storage module 136 may skip the unavailable storage division 160B, and advance the append point 180 to the next available storage division 160C. The log storage module 136 may be configured to continue appending data to storage locations 183-185, at which point the append point 180 continues at a next available storage division 160A-N, as disclosed above.

After storing data on the "last" storage location within the storage address space 144 (e.g., storage location N 189 of storage division 160N), the append point 180 wraps back to the first storage division 160A (or the next available storage division, if storage division 160A is unavailable). Accordingly, the log storage module 136 may treat the storage address space 144 as a loop or cycle.

The storage layer 130 may be configured to modify and/or overwrite data out-of-place. As used herein, modifying and/or overwriting data "out-of-place" refers to performing storage operations at different storage addresses rather than modifying and/or overwriting the data at its current storage location (e.g., overwriting the original physical location of the data "in-place"). Performing storage operations out-of-place may avoid write amplification, since existing, valid data on the storage division 160A-N comprising the data that is being modified need not be erased and/or recopied. Moreover, writing data "out-of-place" may remove erasure from the latency path of many storage operations (the erasure latency is no longer part of the "critical path" of a write operation). In the FIG. 1C embodiment, a storage operation to overwrite and/or modify data corresponding to front-end address A (denoted A0) stored at physical storage location 191 with modified data A1 may be stored out-of-place on a different location (media address 193) within the storage address space 144. Storing the data A1 may comprise updating the storage metadata 135 to associate the front end address A with the storage address of storage location 193 and/or to invalidate the obsolete data A0 at storage address 191. As illustrated in FIG. 1C, updating the storage metadata 135 may comprise updating an entry of the forward map 152 to associate the front-end address A 154E with the storage address of the modified data A1.

In some embodiments, the storage layer 130 is configured to scan the storage address space 144 of the storage medium 140 to identify storage divisions 160A-N to reclaim. As disclosed above, reclaiming a storage division 160A-N may comprise relocating valid data on the storage division 160A-N (if any) and erasing the storage division 160A-N. The storage layer 130 may be further configured to store data in association with persistent metadata (e.g., in a self-describing format). The persistent metadata may comprise information about the data, such as the front-end identifier(s) associated with the data, data size, data length, and the like. Embodiments of a packet format comprising persistent, contextual metadata pertaining to data stored within the storage log are disclosed in further detail below in conjunction with FIG. 3.

Referring back to FIG. 1C, the storage layer 130 may be configured to reconstruct the storage metadata 135 by use of contents of the storage medium 140. In the FIG. 1C embodiment, the current version of the data associated with front-end identifier A stored at storage location 191 may be distinguished from the obsolete version of the data A stored at storage location 193 based on the log order of the packets at storage location 191 and 193, respectively. Since the data packet at 193 is ordered after the data packet at 191, the storage layer 130 may determine that storage location 193 comprises the most recent, up-to-date version of the data A. Accordingly, the reconstructed forward map 152 may associate front-end identifier A with the data stored at storage location 193 (rather than the obsolete data at storage location 191).

Figure 2:
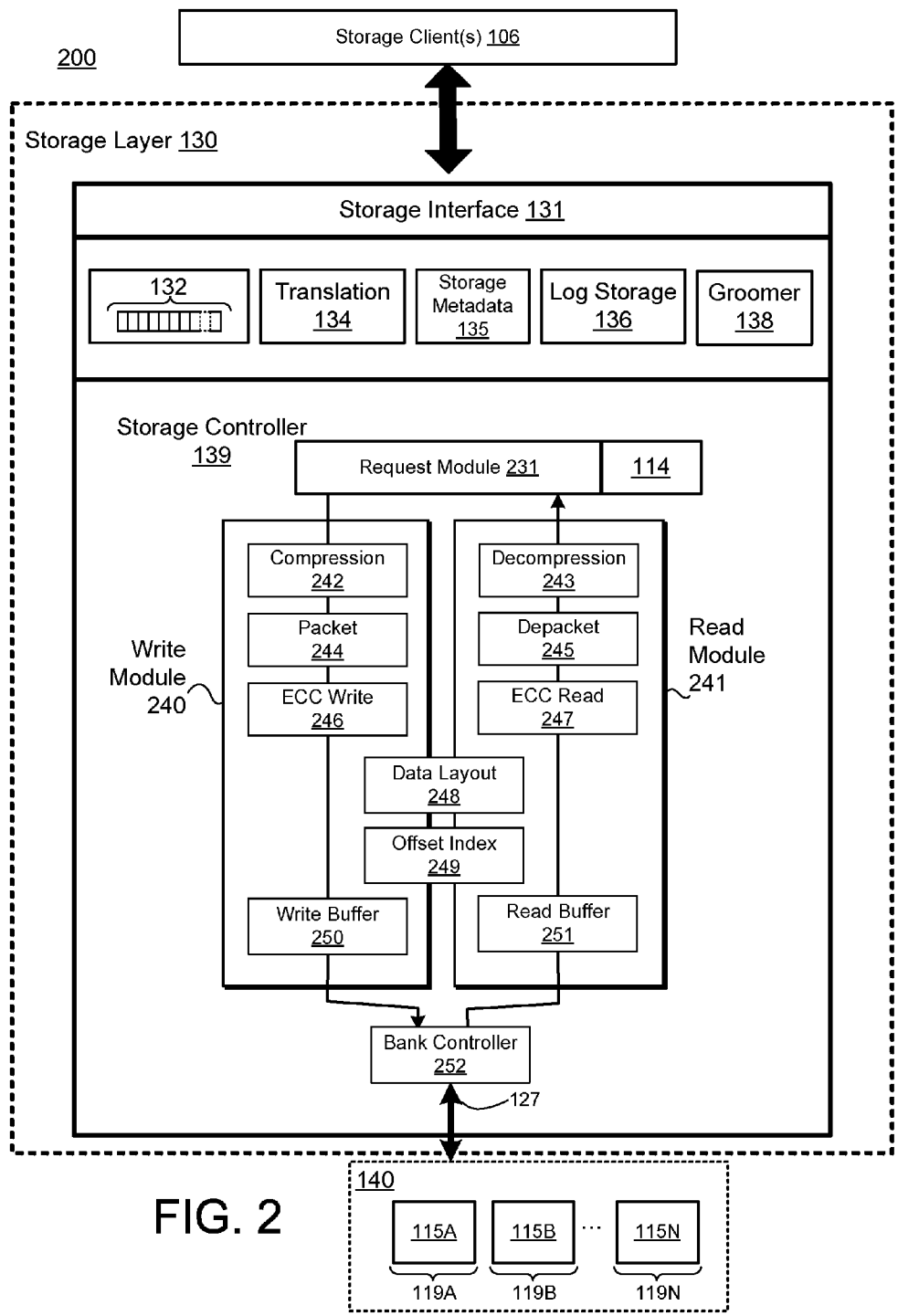
FIG. 2 is a block diagram of another embodiment of a storage layer.

FIG. 2 is a block diagram of a system 200 comprising another embodiment of a storage layer 130 configured to manage data storage operations on a storage medium 140. In some embodiments, the storage medium 140 may comprise one or more independent banks 119A-N of solid-state storage arrays 115A-N. Each of the solid-state storage arrays 115A-N may comprise a plurality of solid-state storage elements (columns 118) communicatively coupled in parallel via the interconnect 127, as disclosed herein.

The storage controller 139 may comprise a request module 231 configured to receive storage requests from the storage layer 130 and/or storage clients 106. The request module 231 may be configured to transfer data to/from the storage controller 139 in response to the requests. Accordingly, the request module 231 may comprise and/or be communicatively coupled to one or more direct memory access (DMA) modules, remote DMA modules, interconnect controllers, bus controllers, bridges, buffers, network interfaces, and the like.

The storage controller 139 may comprise a write module 240 configured to process data for storage on the storage medium 140. In some embodiments, the write module 240 comprises one or more stages configured to process and/or format data for storage on the storage medium 140, which may include, but are not limited to: a compression module 242, a packet module 244, an ECC write module 246, and a write buffer 250. In some embodiments, the write module 240 may further comprise a whitening module, configured to whiten data for storage on the storage medium 140, one or more encryption modules configured to encrypt data for storage on the storage medium 140, and so on. The read module 241 may comprise one or more modules configured to process and/or format data read from the storage medium 140, which may include, but are not limited to: a read buffer 251, the data layout module 248, an ECC read module 247, a depacket module 245, and a decompression module 243.

In some embodiments, the write module 240 comprises a write pipeline configured to process data for storage in a plurality of pipeline stages or modules, as disclosed herein. Similarly, in some embodiments, the read module 241 may comprise a read pipeline configured to process data read from the solid-state storage array 115 in a plurality of pipeline stages or modules, as disclosed herein.

The compression module 242 may be configured to compress data for storage on the storage medium 140. Data may be compressed using any suitable compression algorithm and/or technique. The data compression module 242 may be configured to compress the data, such that a compressed size of the data stored on the storage medium 140 differs from the original, uncompressed size of the data. The compression module 242 may be configured to compress data using different compression algorithms and/or compression levels, which may result in variable compression ratios between the original, uncompressed size of certain data segments and the size of the compressed data segments. The compression module 242 may be further configured to perform one or more whitening transformations on the data segments and/or data packets generated by the packet module 244 (disclosed in further detail below). The data whitening transformations may comprise decorrelating the data, which may provide wear-leveling benefits for certain types of storage media. The compression module 242 may be further configured to encrypt data for storage on the storage medium 140 by use of one or more of a media encryption key, a user encryption key, and/or the like.

Figure 3:
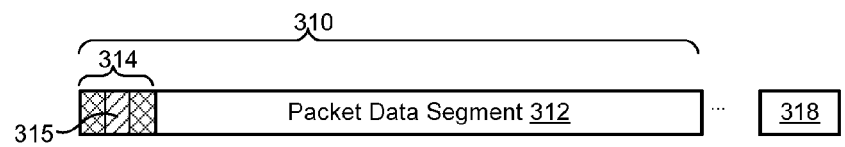
FIG. 3 depicts one embodiment of a packet format.

The packet module 244 may be configured to generate data packets comprising data to be stored on the storage medium 140. As disclosed above, the write module 240 may be configured to store data in a storage log, in which data segments are stored in association with self-describing metadata in a packet format as illustrated in FIG. 3. Referring to FIG. 3, the packet module 244 may be configured to generate packets comprising a data segment 312 and persistent metadata 314. The persistent metadata 314 may include one or more front-end addresses 315 associated with the data segment 312. The data packets 310 may be associated with sequence information, such as a sequence indicator 318, to define, inter alia, a log-order of the data packets 310 within the storage log on the storage medium 140. The sequence indicator 318 may comprise one or more sequence numbers, timestamps, or other indicators from which a relative order of the data packets 310 stored on the storage medium 140 can be determined. The storage layer 130 may use the data packets 310 stored within the storage log on the storage medium 140 to reconstruct portions of the storage metadata 135, which may include, but is not limited to: reconstructing any-to-any mappings 150 between front-end addresses and storage addresses (e.g., the forward map 152), a reverse map, and/or the like.

In some embodiments, the packet module 244 may be configured to generate packets of arbitrary lengths and/or sizes in accordance with the size of storage requests received via the request receiver module 231, data compression performed by the compression module 242, configuration, preferences, and so on. The packet module 244 may be configured to generate packets of one or more pre-determined sizes. In one embodiment, in response to a request to write 24k of data to the solid-state storage medium 110, the packet module 244 may be configured to generate six packets, each packet comprising 4k of the data; in another embodiment, the packet module 244 may be configured to generate a single packet comprising 24k of data in response to the request.

The persistent metadata 314 may comprise the front-end identifier(s) 315 corresponding to the packet data segment 312. Accordingly, the persistent metadata 314 may be configured to associate the packet data segment 312 with one or more LIDs, LBAs, and/or the like. The persistent metadata 314 may be used to associate the packet data segment 312 with the front-end identifier(s) independently of the storage metadata 135. Accordingly, the storage layer 130 may be capable of reconstructing the storage metadata 135 (e.g., the forward map 152) by use of the storage log stored on the storage medium 140. The persistent metadata 314 may comprise other persistent metadata, which may include, but is not limited to, data attributes (e.g., an access control list), data segment delimiters, signatures, links, data layout metadata, and/or the like.

In some embodiments, the data packet 170 may be associated with a log sequence indicator 318. The log sequence indicator 318 may be persisted on the storage division 160A-N comprising the data packet 310. Alternatively, the sequence indicator 318 may be persisted elsewhere on the storage medium 140. In some embodiments, the sequence indicator 178 is applied to the storage divisions 160A-N when the storage divisions 160A-N are reclaimed (e.g., erased, when the first or last storage unit is programmed, etc.). The log sequence indicator 318 may be used to determine the log-order of packets 310 within the storage log stored on the storage medium 140 (e.g., determine an ordered sequence of data packets 170).

Referring back to FIG. 2, the ECC write module 246 may be configured to encode data packets 310 generated by the packet module 244 into respective ECC codewords. As used herein, an ECC codeword refers to data and corresponding error detection and/or correction information. The ECC write module 246 may be configured to implement any suitable ECC algorithm and may be configured to generate corresponding ECC information (e.g., ECC codewords), which may include, but are not limited to: data segments and corresponding ECC syndromes, ECC symbols, ECC chunks, and/or other structured and/or unstructured ECC information. ECC codewords may comprise any suitable error-correcting encoding, including, but not limited to: block ECC encoding, convolutional ECC encoding, Low-Density Parity-Check (LDPC) encoding, Gallager encoding, Reed-Solomon encoding, Hamming codes, Multidimensional parity encoding, cyclic error-correcting codes, BCH codes, and/or the like. The ECC write module 246 may be configured to generate ECC codewords of a pre-determined size. Accordingly, a single packet may be encoded into a plurality of different ECC codewords and/or a single ECC codeword may comprise portions of two or more packets.

In some embodiments, the ECC write module 246 is configured to generate ECC codewords, each of which may comprise a data of length N and a syndrome of length S. For example, the ECC write module 246 may be configured to encode data segments into 240-byte ECC codewords, each ECC codeword comprising 224 bytes of data and 16 bytes of ECC syndrome information. In this embodiment, the ECC encoding may be capable of correcting more bit errors than the manufacturer of the storage medium 140 requires. In other embodiments, the ECC write module 246 may be configured to encode data in a symbolic ECC encoding, such that each data segment of length N produces a symbol of length X. The ECC write module 246 may encode data according to a selected ECC strength. As used herein, the "strength" of an error-correcting code refers to the number of errors that can be detected and/or corrected by use of the error correcting code. In some embodiments, the strength of the ECC encoding implemented by the ECC write module 246 may be adaptive and/or configurable. The strength of the ECC encoding may be selected according to the reliability and/or error rate of the storage medium 140. As disclosed in further detail herein, the strength of the ECC encoding may be independent of the partitioning and/or data layout on the storage medium 140, which may allow the storage layer 130 to select a suitable ECC encoding strength based on the conditions of the storage medium 140, user requirements, and the like, as opposed to static and/or pre-determined ECC settings imposed by the manufacturer of the storage medium 140.

Figure 4:
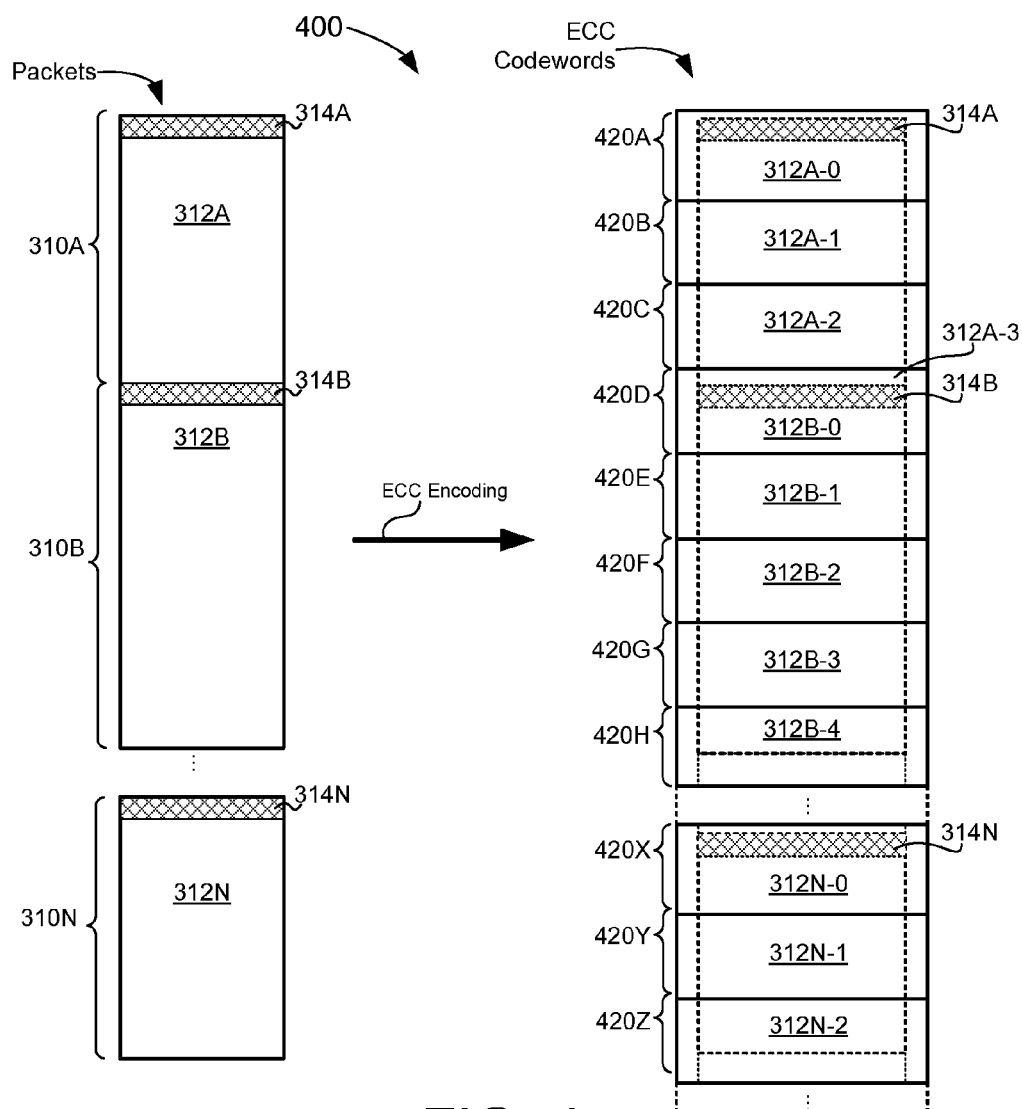
FIG. 4 depicts one embodiment of ECC codewords comprising one or more data segments.

FIG. 4 depicts one embodiment of data flow 400 between the packet module 244 and an ECC write module 246. For clarity, and to avoid obscuring the details of the depicted embodiment, other portions of the write module 240 are omitted. The packet module 244 may be configured to generate packets 310A-310N in response to one or more requests to store data on the storage medium 140. The packets 310A-N may comprise respective packet data segments 312A, 312B, and 312N. The packets 310A-N may further comprise persistent metadata embodied in respective packet headers 314A, 314B, and 314N. The packets 310A-N may be processed by, inter alia, the ECC write module 246 to generate ECC codewords 420A-Z. In the FIG. 4 embodiment, the ECC codewords comprise ECC codewords 420A-

420Z, each of which may comprise a portion of one or more of the packets 310A-N and a syndrome (not shown). In other embodiments, the ECC codewords may comprise ECC symbols or the like.

As illustrated in FIG. 4, the packets 310A-N may vary in size in accordance with the size of the respective packet data segments 312A-N and/or header information 314A-N. Alternatively, in some embodiments, the packet module 244 may be configured to generate packets 310A-N of a fixed, uniform size.

The ECC write module 246 may be configured to generate ECC codewords 420A-N having a uniform, fixed size; each ECC codeword 420A-N may comprise N bytes of packet data and S syndrome bytes, such that each ECC codeword 420A-N comprises N+S bytes. In some embodiments, each ECC codeword comprises 240 bytes, and includes 224 bytes of packet data (N) and 16 byes of error correction code (S). The disclosed embodiments are not limited in this regard, however, and could be adapted to generate ECC codewords 420A-N of any suitable size, having any suitable ratio between N and S. Moreover, the ECC write module 242 may be further adapted to generate ECC symbols, or other ECC codewords, comprising any suitable ratio between data and ECC information.

As depicted in FIG. 4, the ECC codewords 420A-N may comprise portions of one or more packets 310A-N; ECC codeword 420D comprises data of packets 310A and 310B. The packets 310A-N may be spread between a plurality of different ECC codewords 420A-N: ECC codewords 420A-D comprise data of packet 310A; ECC codewords 420D-H comprise data of packet 310B; and ECC codewords 420X-Z comprise data of packet 310N.

Referring back to FIG. 2, the write module 240 may further comprise a data layout module 248 configured to buffer data for storage on one or more of the solid-state storage arrays 115A-N. As disclosed in further detail herein, the data layout module 248 may be configured to store data within one or more columns 118 of a solid-state storage array 115. The data layout module 248 may be further configured to generate parity data associated corresponding to the layout and/or arrangement of the data on the storage medium 140. The parity data may be configured to protect data stored within respective rows 117 of the solid-state storage array 115A-N, and may be generated in accordance with the data layout implemented by the storage controller 139.

In some embodiments, the write module 240 further comprises a write buffer 250 configured to buffer data for storage within respective page write buffers of the storage medium 140. The write buffer 250 may comprise one or more synchronization buffers to synchronize a clock domain of the storage controller 139 with a clock domain of the storage medium 140 (and/or interconnect 127).

The log storage module 136 may be configured to select storage location(s) for data storage operations and/or may provide addressing and/or control information to the storage controller 139. Accordingly, the log storage module 136 may provide for storing data sequentially at an append point 180 within the storage address space 144 of the storage medium 140. The storage address at which a particular data segment is stored may be independent of the front-end identifier(s) associated with the data segment. As disclosed above, the translation module 134 may be configured to associate the front-end interface of data segments (e.g., front-end identifiers of the data segments) with the storage address(es) of the data segments on the storage medium 140. In some embodiments, the translation module 134 may leverage storage metadata 135 to perform logical-to-physical translations; the storage metadata 135 may include, but is not limited to: a forward map 152 comprising arbitrary, any-to-any mappings 150 between front-end identifiers and storage addresses; a reverse map comprising storage address validity indicators and/or any-to-any mappings between storage addresses and front-end identifiers; and so on. The storage metadata 135 may be maintained in volatile memory, such as the volatile memory 102 of the computing system 100. In some embodiments, the storage layer 130 is configured to periodically store portions of the storage metadata 135 on a persistent storage medium, such as the storage medium 140, non-volatile storage resources 103, and/or the like.

The storage controller 139 may further comprise a read module 241 that is configured to read data from the storage medium 140 in response to requests received via the request module 231. The read module 241 may be configured to process data read from the storage medium 140, and provide the processed data to the storage layer 130 and/or a storage client 106 (by use of the request module 231). The read module 241 may comprise one or more modules configured to process and/or format data read from the storage medium 140, which may include, but is not limited to: read buffer 251, data layout module 248, ECC read module 247, a depacket 245, and a decompression module 243. In some embodiments, the read module 241 further includes a dewhiten module configured to perform one or more dewhitening transforms on the data, a decryption module configured to decrypt encrypted data stored on the storage medium 140, and so on. Data processed by the read module 241 may flow to the storage layer 130 and/or directly to the storage client 106 via the request module 231, and/or other interface or communication channel (e.g., the data may flow directly to/from a storage client via a DMA or remote DMA module of the storage layer 130).

Read requests may comprise and/or reference the data using the front-end interface of the data, such as a front-end identifier (e.g., a logical identifier, an LBA, a range and/or extent of identifiers, and/or the like). The back-end addresses associated with data of the request may be determined based, inter alia, on the any-to-any mappings 150 maintained by the translation module 134 (e.g., forward map 152), metadata pertaining to the layout of the data on the storage medium 140, and so on. Data may stream into the read module 241 via a read buffer 251. The read buffer 251 may correspond to page read buffers of one or more of the solid-state storage arrays 115A-N. The read buffer 251 may comprise one or more synchronization buffers configured to synchronize a clock domain of the read buffer 251 with a clock domain of the storage medium 140 (and/or interconnect 127).

The data layout module 248 may be configured to reconstruct one or more data segments from the contents of the read buffer 251. Reconstructing the data segments may comprise recombining and/or reordering contents of the read buffer (e.g., ECC codewords) read from various columns 118 in accordance with a layout of the data on the solid-state storage arrays 115A-N as indicated by the storage metadata 135. As disclosed in further detail herein, in some embodiments, reconstructing the data may comprise stripping data associated with one or more columns 118 from the read buffer 251, reordering data of one or more columns 118, and so on.

The read module 241 may comprise an ECC read module 247 configured to detect and/or correct errors in data read from the solid-state storage medium 110 using, inter alia, the ECC encoding of the data (e.g., as encoded by the ECC write module 246), parity data (e.g., using parity substitution), and so on. As disclosed above, the ECC encoding may be capable of detecting and/or correcting a pre-determined number of bit errors, in accordance with the strength of the ECC encoding. The ECC read module 247 may be capable of detecting more bit errors than can be corrected.

The ECC read module 247 may be configured to correct any "correctable" errors using the ECC encoding. In some embodiments, the ECC read module 247 may attempt to correct errors that cannot be corrected by use of the ECC encoding using other techniques, such as parity substitution, or the like. Alternatively, or in addition, the ECC read module 247 may attempt to recover data comprising uncorrectable errors from another source. For example, in some embodiments, data may be stored in a RAID configuration. In response to detecting an uncorrectable error, the ECC read module 247 may attempt to recover the data from the RAID, or other source of redundant data (e.g., a mirror, backup copy, or the like).

In some embodiments, the ECC read module 247 may be configured to generate an interrupt in response to reading data comprising uncorrectable errors. The interrupt may comprise a message indicating that the requested data is in error, and may indicate that the ECC read module 247 cannot correct the error using the ECC encoding. The message may comprise the data that includes the error (e.g., the "corrupted data").

The interrupt may be caught by the storage layer 130 or other process, which, in response, may be configured to reconstruct the data using parity substitution, or other reconstruction technique, as disclosed herein. Parity substitution may comprise iteratively replacing portions of the corrupted data with a "parity mask" (e.g., all ones) until a parity calculation associated with the data is satisfied. The masked data may comprise the uncorrectable errors, and may be reconstructed using other portions of the data in conjunction with the parity data. Parity substitution may further comprise reading one or more ECC codewords from the solid-state storage array 115A-N (in accordance with an adaptive data structure layout on the array 115), correcting errors within the ECC codewords (e.g., decoding the ECC codewords), and reconstructing the data by use of the corrected ECC codewords and/or parity data. In some embodiments, the corrupted data may be reconstructed without first decoding and/or correcting errors within the ECC codewords. Alternatively, uncorrectable data may be replaced with another copy of the data, such as a backup or mirror copy. In another embodiment, the storage layer 130 stores data in a RAID configuration, from which the corrupted data may be recovered.

As depicted in FIG. 2, the solid-state storage medium 140 may be arranged into a plurality of independent banks 119A-N. Each bank may comprise a plurality of solid-state storage elements arranged into respective solid-state storage arrays 115A-N. The banks 119A-N may be configured to operate independently; the storage controller 139 may configure a first bank 119A to perform a first storage operation while a second bank 119B is configured to perform a different storage operation. The storage controller 139 may further comprise a bank controller 252 configured to selectively route data and/or commands to respective banks 119A-N. In some embodiments, storage controller 139 is configured to read data from a bank 119A while filling the write buffer 250 for storage on another bank 119B and/or may interleave one or more storage operations between one or more banks 119A-N. Further embodiments of multi-bank storage operations and data pipelines are disclosed in U.S. Patent Application Publication No. 2008/0229079 (U.S. patent application Ser. No. 11/952,095), entitled, "Apparatus, System, and Method for Managing Commands of Solid-State Storage Using Bank Interleave," filed Dec. 6, 2007 for David Flynn et al., which is hereby incorporated by reference in its entirety.

The storage layer 130 may further comprise a groomer module 138 configured to reclaim storage resources of the storage medium 140. The groomer module 138 may operate as an autonomous, background process, which may be suspended and/or deferred while other storage operations are in process. The log storage module 136 and groomer module 138 may manage storage operations so that data is spread throughout the storage address space 144 of the storage medium 140, which may improve performance and data reliability, and avoid overuse and underuse of any particular storage locations, thereby lengthening the useful life of the storage medium 140 (e.g., wear-leveling, etc.). As disclosed above, data may be sequentially appended to a storage log within the storage address space 144 at an append point 180, which may correspond to a particular storage address within one or more of the banks 119A-N (e.g., physical address 0 of bank 119A). Upon reaching the end of the storage address space 144 (e.g., physical address N of bank 119N), the append point 180 may revert to the initial position (or next available storage location).

As disclosed above, operations to overwrite and/or modify data stored on the storage medium 140 may be performed "out-of-place." The obsolete version of overwritten and/or modified data may remain on the storage medium 140 while the updated version of the data is appended at a different storage location (e.g., at the current append point 180). Similarly, an operation to delete, erase, or TRIM data from the storage medium 140 may comprise indicating that the data is invalid (e.g., does not need to be retained on the storage medium 140). Marking data as invalid may comprise modifying a mapping between the front-end identifier(s) of the data and the storage address(es) comprising the invalid data, marking the storage address as invalid in a reverse map, and/or the like.

The groomer module 138 may be configured to select sections of the solid-state storage medium 140 for grooming operations. As used herein, a "section" of the storage medium 140 may include, but is not limited to: an erase block, a logical erase block, a die, a plane, one or more pages, a portion of a solid-state storage element 116A-Y, a portion of a row 117 of a solid-state storage array 115, a portion of a column 118 of a solid-state storage array 115, and/or the like. A section may be selected for grooming operations in response to various criteria, which may include, but are not limited to: age criteria (e.g., data refresh), error metrics, reliability metrics, wear metrics, resource availability criteria, an invalid data threshold, and/or the like. A grooming operation may comprise relocating valid data on the selected section (if any). The operation may further comprise preparing the section for reuse, which may comprise erasing the section, marking the section with a sequence indicator, such as the sequence indicator 318, and/or placing the section into a queue of storage sections that are available to store data. The groomer module 138 may be configured to schedule grooming operations with other storage operations and/or requests. In some embodiments, the storage controller 139 may comprise a groomer bypass (not shown) configured to relocate data from a storage section by transferring data read from the section from the read module 241 directly into the write module 240 without being routed out of the storage controller 139.

The storage layer 130 may be further configured to manage out-of-service conditions on the storage medium 140. As used herein, a section of the storage medium 140 that is "out-of-service" (OOS) refers to a section that is not currently being used to store valid data. The storage layer 130 may be configured to monitor storage operations performed on the storage medium 140 and/or actively scan the solid-state storage medium 140 to identify sections that should be taken out of service. The storage metadata 135 may comprise OOS metadata that identifies OOS sections of the solid-state storage medium 140. The storage layer 130 may be configured to avoid OOS sections by, inter alia, streaming padding (and/or nonce) data to the write buffer 250 such that padding data will map to the identified OOS sections. In some embodiments, the storage layer 130 may be configured to manage OOS conditions by replacing OOS sections of the storage medium 140 with replacement sections. Alternatively, or in addition, a hybrid OOS approach may be used that combines adaptive padding and replacement techniques; the padding approach to managing OOS conditions may be used in portions of the storage medium 140 comprising a relatively small number of OOS sections; as the number of OOS sections increases, the storage layer 130 may replace one or more of the OOS sections with replacements sections. Further embodiments of apparatus, systems, and methods for detecting and/or correcting data errors, and managing OOS conditions, are disclosed in U.S. Patent Application Publication No. 2009/0287956 (U.S. application Ser. No. 12/467,914), entitled, "Apparatus, System, and Method for Detecting and Replacing a Failed Data Storage," filed May 18, 2009, and U.S. Patent Application Publication No. 2013/0019072 (U.S. application Ser. No. 13/354,215), entitled, "Apparatus, System, and Method for Managing Out-of-Service Conditions," filed Jan. 19, 2012 for John Strasser et al., each of which is hereby incorporated by reference in its entirety.

As disclosed above, the storage medium 140 may comprise one or more solid-state storage arrays 115A-N. A solid-state storage array 115A-N may comprise a plurality of independent columns 118 (respective solid-state storage elements 116A-Y), which may be coupled to the storage layer 130 in parallel via the interconnect 127. Accordingly, storage operations performed on an array 115A-N may be performed on a plurality of solid-state storage elements 116A-Y. Performing a storage operation on a solid-state storage array 115A-N may comprise performing the storage operation on each of the plurality of solid-state storage elements 116A-Y comprising the array 115A-N: a read operation may comprise reading a physical storage unit (e.g., page) from a plurality of solid-state storage elements 116A-Y; a program operation may comprise programming a physical storage unit (e.g., page) on a plurality of solid-state storage elements 116A-Y; an erase operation may comprise erasing a section (e.g., erase block) on a plurality of solid-state storage elements 116A-Y; and so on. Accordingly, a program operation may comprise the write module 240 streaming data to program buffers of a plurality of solid-state storage elements 116A-Y (via the write buffer 250 and interconnect 127) and, when the respective program buffers are sufficiently full, issuing a program command to the solid-state storage elements 116A-Y. The program command may cause one or more storage units on each of the storage elements 116A-Y to be programmed in parallel.

Figure 5A:
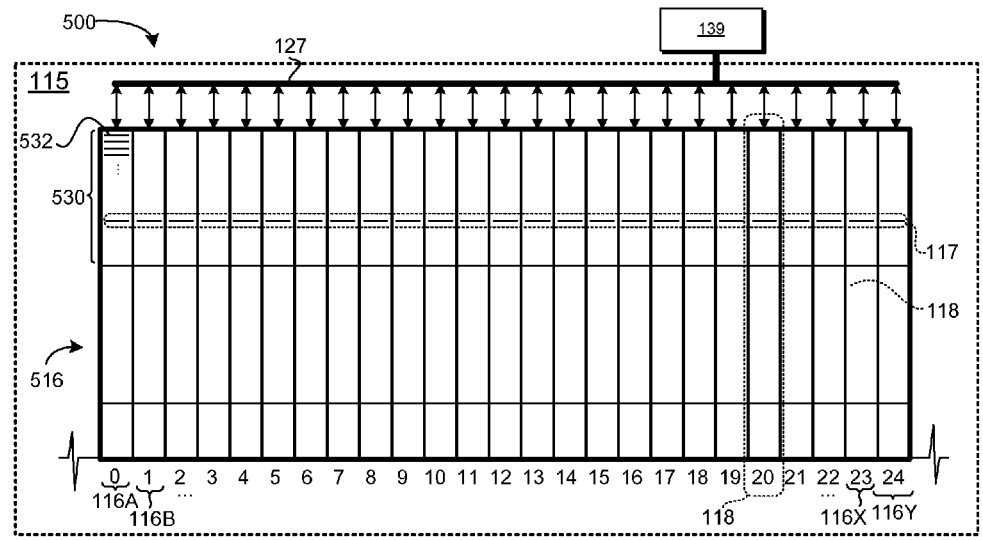
FIG. 5A is a block diagram depicting one embodiment of a solid-state storage array.

FIG. 5A depicts another embodiment 500 of a solid-state storage array 115. As disclosed above, the solid-state storage array 115 may comprise a plurality of independent columns 118, each of which may correspond to a respective set of one or more solid-state storage elements 116A-Y. In the FIG. 5A embodiment, the solid-state storage array 115 comprises 25 columns 118 (e.g., solid-state storage element 0 116A through solid-state storage element 24 116Y). The solid-state storage elements 116A-Y comprising the array may be communicatively coupled to the storage layer 130 in parallel by the interconnect 127. The interconnect 127 may be capable of communicating data, addressing, and/or control information to each of the solid-state storage elements 116A-Y. The parallel connection may allow the storage controller 139 to manage the solid-state storage elements 116A-Y in parallel, as a single, logical storage element.

The solid-state storage elements 116A-Y may be partitioned into sections, such as physical storage divisions 530 (e.g., physical erase blocks). Each erase block may comprise a plurality of physical storage units 532, such as pages. The physical storage units 532 within a physical storage division 530 may be erased as a group. Although FIG. 5A depicts a particular partitioning scheme, the disclosed embodiments are not limited in this regard, and could be adapted to use solid-state storage elements 116A-Y partitioned in any suitable manner.

As depicted in FIG. 5A, the columns 118 of the array 115 may correspond to respective solid-state storage elements 116A-Y. Accordingly, the array 115 of FIG. 5A comprises 25 columns 118. Rows of the array 117 may correspond to physical storage units 532 and/or 530 of a plurality of the columns 118. In other embodiments, the columns 118 may comprise multiple solid-state storage elements.

Figure 5B:
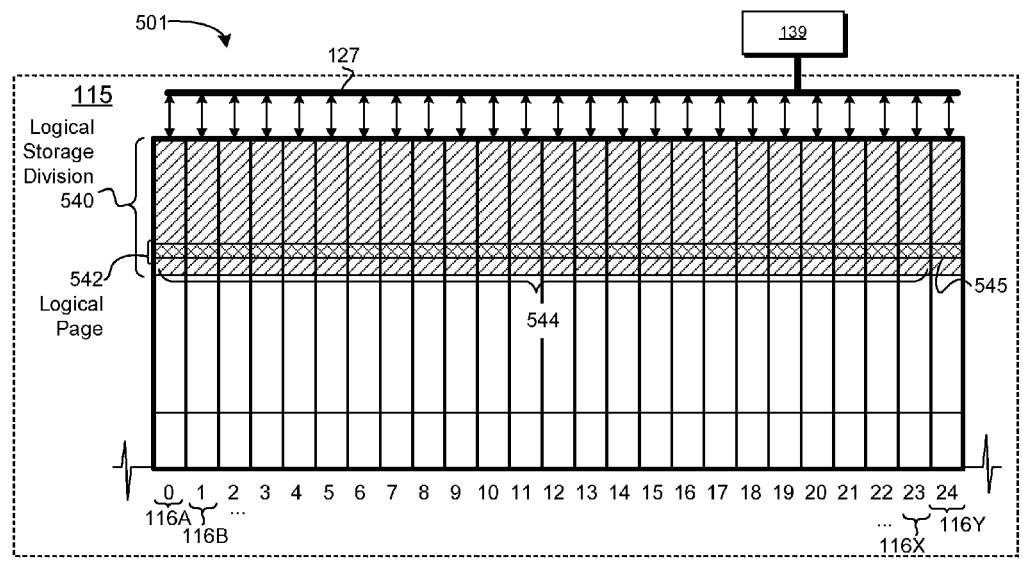
FIG. 5B is a block diagram depicting another embodiment of a solid-state storage array.

FIG. 5B is a block diagram 501 of another embodiment of a solid-state storage array 115. The solid-state storage array 115 may comprise a plurality of rows 117, which may correspond to storage units on a plurality of different columns 118 within the array 115. The rows 117 of the solid-state storage array 115 may include logical storage divisions 540, which may comprise physical storage divisions on a plurality of the solid-state storage elements 116A-Y. In some embodiments, a logical storage division 540 may comprise a logical erase block, comprising physical erase blocks of the solid-state storage elements 116A-Y within the array 115. A logical page 542 may comprise physical storage units (e.g., pages) on a plurality of the solid-state storage elements 116A-Y.

Storage operations performed on the solid-state storage array 115 may operate on multiple solid-state storage elements 116A-Y: an operation to program data to a logical storage unit 542 may comprise programming data to each of 25 physical storage units (e.g., one storage unit per non-volatile storage element 116A-Y); an operation to read data from a logical storage unit 542 may comprise reading data from 25 physical storage units (e.g., pages); an operation to erase a logical storage division 540 may comprise erasing 25 physical storage divisions (e.g., erase blocks); and so on. Since the columns 118 are independent, storage operations may be performed across different sets and/or portions of the array 115. For example, a read operation on the array 115 may comprise reading data from physical storage unit 532 at a first physical address of solid-state storage element 116A and reading data from a physical storage unit 532 at a different physical address of one or more other solid-state storage elements 116B-N.

Arranging solid-state storage elements 116A-Y into a solid-state storage array 115 may be used to address certain properties of the storage medium 140. Some embodiments may comprise an asymmetric storage medium 140, in which it takes longer to program data onto the solid-state storage elements 116A-Y than it takes to read data therefrom (e.g., 10 times as long). Moreover, in some cases, data may only be programmed to physical storage divisions 530 that have first been initialized (e.g., erased). Initialization operations may take longer than program operations (e.g., 10 times as long as a program, and by extension 100 times as long as a read operation). Managing groups of solid-state storage elements 116A-Y in an array 115 (and/or in independent banks 119A-N as disclosed herein) may allow the storage layer 130 to perform storage operations more efficiently, despite the asymmetric properties of the storage medium 140. In some embodiments, the asymmetry in read, program, and/or erase operations is addressed by performing these operations on multiple solid-state storage elements 116A-Y in parallel. In the embodiment depicted in FIG. 5B, programming asymmetry may be addressed by programming 25 storage units in a logical storage unit 542 in parallel. Initialization operations may also be performed in parallel. Physical storage divisions 530 on each of the solid-state storage elements 116A-Y may be initialized as a group (e.g., as logical storage divisions 540), which may comprise erasing 25 physical erase blocks in parallel.

In some embodiments, portions of the solid-state storage array 115 may be configured to store data and other portions of the array 115 may be configured to store error detection and/or recovery information. Columns 118 used for data storage may be referred to as "data columns" and/or "data solid-state storage elements." Columns used to store data error detection and/or recovery information may be referred to as a "parity column" and/or "recovery column." The array 115 may be configured in an operational mode in which one of the solid-state storage elements 116Y is used to store parity data, whereas other solid-state storage elements 116A-X are used to store data. Accordingly, the array 115 may comprise data solid-state storage elements 116A-X and a recovery solid-state storage element 116Y. In this operational mode, the effective storage capacity of the rows (e.g., logical pages 542) may be reduced by one physical storage unit (e.g., reduced from 25 physical pages to 24 physical pages). As used herein, the "effective storage capacity" of a storage unit refers to the number of storage units or divisions that are available to store data and/or the total amount of data that can be stored on a logical storage unit. The operational mode described above may be referred to as a "24+1" configuration, denoting that twenty-four (24) physical storage units 532 are available to store data, and one (1) of the physical storage units 532 is used for parity. The disclosed embodiments are not limited to any particular operational mode and/or configuration, and could be adapted to use any number of the solid-state storage elements 116A-Y to store error detection and/or recovery data.

Figure 5C:
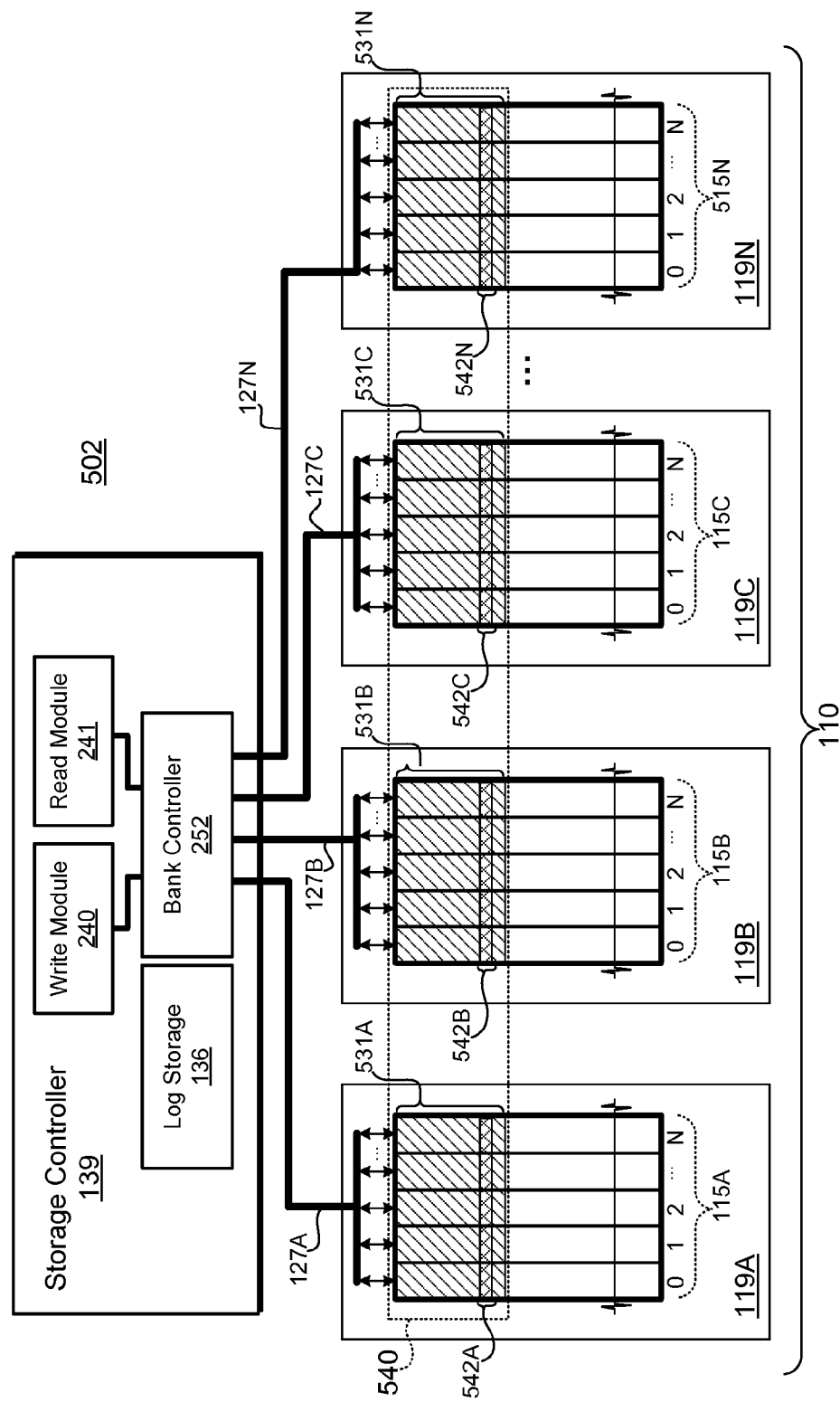
FIG. 5C is a block diagram depicting another embodiment of banks of solid-state storage arrays.

As disclosed above, the storage controller 139 may be configured to interleave storage operations between a plurality of independent banks 119A-N of solid-state storage arrays 115A-N, which may further ameliorate asymmetry between erase, program, and read operations. FIG. 5C is a block diagram of a system 502 comprising a storage controller 139 configured to manage storage divisions (logical erase blocks 540) that span multiple arrays 115A-N of multiple banks 119A-N. Each bank 119A-N may comprise one or more solid-state storage arrays 115A-N, which, as disclosed herein, may comprise a plurality of solid-state storage elements 116A-Y coupled in parallel by a respective bus 127A-N. The storage controller 139 may be configured to perform storage operations on the storage elements 116A-Y of the arrays 119A-N in parallel and/or in response to a single command and/or signal.

Some operations performed by the storage controller 139 may cross bank boundaries. The storage controller 139 may be configured to manage groups of logical erase blocks 540 that include erase blocks of multiple arrays 115A-N within different respective banks 119A-N. Each group of logical erase blocks 540 may comprise erase blocks 531A-N on each of the arrays 115A-N. The erase blocks 531A-N comprising the logical erase block group 540 may be erased together (e.g., in response to a single erase command and/or signal or in response to a plurality of separate erase commands and/or signals). Performing erase operations on logical erase block groups 540 comprising large numbers of erase blocks 531A-N within multiple arrays 115A-N may further mask the asymmetric properties of the solid-state storage medium 140, as disclosed herein.

The storage controller 139 may be configured to perform some storage operations within boundaries of the arrays 115A-N and/or banks 119A-N. In some embodiments, the read, write, and/or program operations may be performed within rows 117 of the solid-state storage arrays 115A-N (e.g., on logical pages 542A-N within arrays 115A-N of respective banks 119A-N). As depicted in FIG. 5C, the logical pages 542A-N of the arrays 115A-N may not extend beyond single arrays 115A-N and/or banks 119A-N. The log storage module 136 and/or bank interleave module 252 may be configured to append data to the storage medium 140 by interleaving and/or scheduling storage operations sequentially between the arrays 115A-N of the banks 119A-N.

Figure 5D:
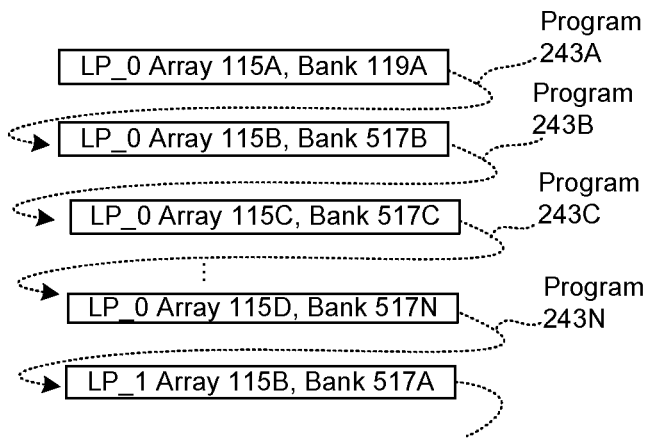
FIG. 5D depicts one embodiment of sequential bank interleave.

FIG. 5D depicts one embodiment of storage operations that are interleaved between solid-state storage arrays 115A-N of respective banks 119A-N. In the FIG. 5D embodiment, the bank interleave module 252 is configured to interleave programming operations between logical pages 542A-N (rows 117) of the arrays 115A-N within the banks 119A-N. As disclosed above, the write module 240 may comprise a write buffer 250, which may have sufficient capacity to fill write buffers one or more logical pages 542A-N of an array 115A-N. In response to filling the write buffer 250 (e.g., buffering data sufficient to fill a portion of a logical page 542A-N), the storage controller 139 may be configured to stream the contents of the write buffer 250 to program buffers of the solid-state storage elements 116A-Y comprising one of the banks 119A-N. The write module 240 may then issue a program command and/or signal to the solid-state storage array 115A-N to store the contents of the program buffers to a specified logical page 542A-N. The log storage module 136 and/or bank interleave module 252 may be configured to provide control and addressing information to the solid-state storage elements 116A-Y of the array 115A-N using a bus 127A-N, as disclosed above.

The bank interleave module 252 may be configured to append data to the solid-state storage medium 110 by programming data to the arrays 115A-N in accordance with a sequential interleave pattern. The sequential interleave pattern may comprise programming data to a first logical page (LP_0) of array 115A within bank 119A, followed by the first logical page (LP_0) of array 115B within the next bank 119B, and so on, until data is programmed to the first logical page LP_0 of each array 115A-N within each of the banks 119A-N. As depicted in FIG. 5D, data may be programmed to the first logical page LP_0 of array 115A in bank 119A in a program operation 243A. The bank interleave module 252 may then stream data to the first logical page (LP_0) of the array 115B in the next bank 119B. The data may then be programmed to LP_0 of array 115B in bank 119B in a program operation 243B. The program operation 243B may be performed concurrently with the program operation 243A on array 115A of bank 119A; the data write module 240 may stream data to array 115B and/or issue a command and/or signal for the program operation 243B, while the program operation 243A is being performed on the array 115A. Data may be streamed to and/or programmed on the first logical page (LP_0) of the arrays 115C-N of the other banks 119C-119N following the same sequential interleave pattern (e.g., after data is streamed and/or programmed to LP_0 of array 115A of bank 119B, data is streamed and/or programmed to LP_0 of array 115C of bank 119C in program operation 243C, and so on). Following the programming operation 243N on LP_0 of array 115N within the last bank 119N, the bank interleave controller 252 may be configured to begin streaming and/or programming data to the next logical page (LP_1) of array 115A within the first bank 119A, and the interleave pattern may continue accordingly (e.g., program LP_1 of array 115B bank 119B, followed by LP_1 of array 115C bank 119C through LP_1 of array 115N bank 119N, followed by LP_2 of array 115A bank 119A, and so on).

Sequentially interleaving programming operations as disclosed herein may increase the time between concurrent programming operations on the same array 115A-N and/or bank 119A-N, which may reduce the likelihood that the storage controller 139 will have to stall storage operations while waiting for a programming operation to complete. As disclosed above, programming operations may take significantly longer than other operations, such as read and/or data streaming operations (e.g., operations to stream the contents of the write buffer 250 to an array 115A-N via the bus 127A-N). The interleave pattern of FIG. 5D may be configured to avoid consecutive program operations on the same array 115A-N and/or bank 119A-N; programming operations on a particular array 115A-N may be separated by N−1 programming operations on other banks (e.g., programming operations on array 115A are separated by programming operations on arrays 115A-N). As such, programming operations on array 119A are likely to be complete before another programming operation needs to be performed on the array 119A.

Figure 5E:
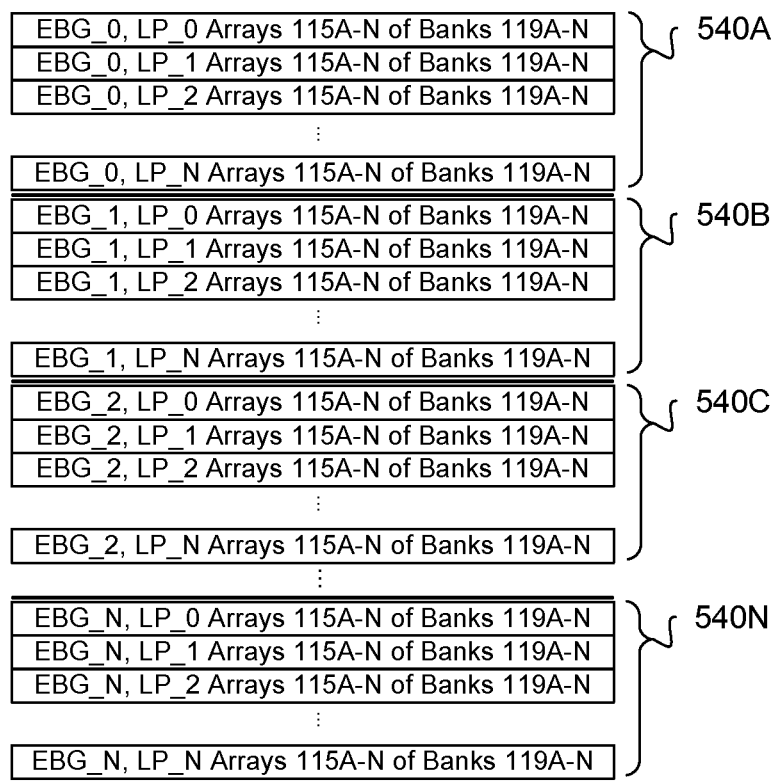
FIG. 5E depicts another embodiment of sequential bank interleave.

As depicted in FIG. 5D, the interleave pattern for programming operations may comprise programming data sequentially across rows 117 (e.g., logical pages 542A-N) of a plurality of arrays 115A-N. As depicted in FIG. 5E, the interleave pattern may result in interleaving programming operations between arrays 115A-N of banks 119A-N, such that the erase blocks of each array 115A-N (erase block groups EBG_0-N) are filled at the same rate. The sequential interleave pattern programs data to the logical pages of the first erase block group (EBG_0) in each array 115A-N before programming data to logical pages LP_0 through LP_N of the next erase block group (EBG_1), and so on (e.g., wherein each erase block comprises 0-N pages). The interleave pattern continues until the last erase block group EBG_N is filled, at which point the interleave pattern continues back at the first erase block group EBG_0.

The erase block groups of the arrays 115A-N may, therefore, be managed as logical erase blocks 540A-N that span the arrays 115A-N. Referring to FIG. 5C, a logical erase block group 540 may comprise erase blocks 531A-N on each of the arrays 115A-N within the banks 119A-N. As disclosed above, managing groups of erase blocks (e.g., logical erase block group 540) may comprise erasing each of the erase blocks 531A-N included in the group 540. In the FIG. 5E embodiment, erasing the logical erase block group 540A may comprise erasing EBG_0 of arrays 115A-N in banks 119A-N, erasing a logical erase block group 540B may comprise erasing EBG_1 of arrays 115A-N in banks 517A-N, erasing logical erase block group 540C may comprise erasing EBG_2 of arrays 115A-N in banks 517A-N, and erasing logical erase block group 540N may comprise erasing EBG_N of arrays 115A-N in banks 517A-N. Other operations, such as grooming, recovery, and the like may be performed at the granularity of the logical erase block groups 540A-N; recovering the logical erase block group 540A may comprise relocating valid data (if any) stored on EBG_0 on arrays 115A-N in banks 517A-N, erasing the erase blocks of each EBG_0 in arrays A-N, and so on. Accordingly, in embodiments comprising four banks 119A-N, each bank 119A-N comprising a respective solid-state storage array 115A-N comprising 25 storage elements 116A-Y, erasing, grooming, and/or recovering a logical erase block group 540 comprises erasing, grooming, and/or recovering 100 physical erase blocks 530. Although particular multi-bank embodiments are described herein, the disclosure is not limited in this regard and could be configured using any multi-bank architecture comprising any number of banks 119A-N of arrays 115A-N comprising any number of solid-state storage elements 116A-Y.

Referring back to FIG. 2, the storage layer 130 may be configured to store data segments in one or more different configurations, arrangements and/or layouts within a solid-state storage array 115A-N (by use of the data layout module 248). The data layout module 248 may be configured to buffer and/or arrange data in the write module 240 for storage in a particular arrangement within one or more of the solid-state storage arrays 115A-N. Referring to FIG. 5B, in some embodiments, the data layout module 248 may configure data for "horizontal" storage within rows 117 of the array 115 (e.g., horizontally within logical storage units 542 of the array 115). Accordingly, a datastructure, such as an ECC codeword, packet, or the like, may be spread across a plurality of the storage elements 116A-Y comprising the logical storage unit 542. In some embodiments, data may be stored horizontally within one or more independent "channels" of the array 115. As used herein, an independent channel (or "channel") refers to a subset of one or more columns 118 of the array 115 (e.g., respective subsets of solid-state storage elements 116A-Y). Data may be arranged for storage within respective independent channels. An array 115 comprising N columns 118 may be divided into a configurable number of independent channels X, each comprising Y columns 118 of the array 115. In the FIG. 5B embodiment having a "24+1" configuration that comprises 24 columns 118 for storing data, the channel configurations may include, but are not limited to: 24 channels each comprising a single column 118; 12 channels each comprising two solid-state storage elements; eight channels each comprising three solid-state storage elements; six channels each comprising six columns 118; and so on. In some embodiments, the array 115 may be divided into heterogeneous channels, such as a first channel comprising 12 columns 118 and six other channels each comprising two columns 118. In other embodiments, the data layout module 248 may be configured to arrange data for storage in a vertical code word configuration (disclosed in further detail below).

Figure 6A:
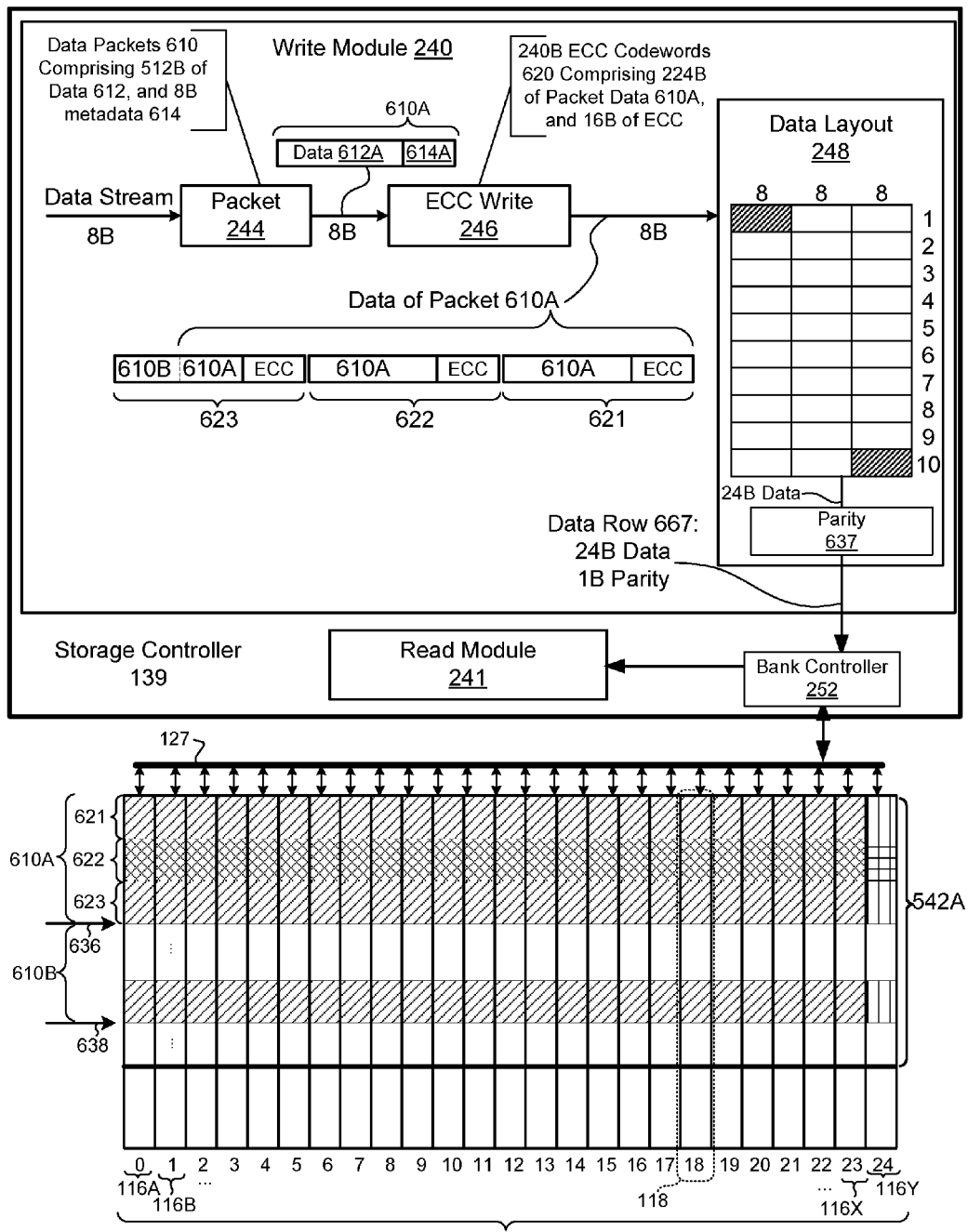
FIG. 6A is a block diagram of another embodiment of a storage controller.

FIG. 6A is a block diagram of a system 600 comprising one embodiment of a storage controller 139 comprising a data layout module 248 configured to arrange data for storage on a solid-state storage array 115 in a horizontal configuration. The solid-state storage array 115 comprises 25 solid-state storage elements 116A-Y operating in a "24+1" configuration, in which 24 of the solid-state storage elements 116A-X are used to store data, and one storage element (116Y) is used to store parity data.

The write module 240 may comprise a packet module 244 configured to generate data packets comprising data segments for storage on the array 115, as disclosed above. In the FIG. 6A embodiment, the packet module 244 is configured to format data into a packet format 610, comprising a packet data segment 612 and persistent metadata 614 (e.g., header). The header 614 may comprise a front-end interface of the packet data segment 612, a sequence number, and/or the like, as disclosed above. In the FIG. 6A embodiment, the packet module 244 is configured to generate packets 610 of a fixed size (520-byte packet data segment 612 and 8 bytes of metadata 614).

The ECC write module 246 is configured to generate ECC datastructures (ECC codewords 620) comprising portions of one or more packets 610, as disclosed above. The ECC codewords 620 may be of a fixed size. In the FIG. 6A example, each ECC codeword 620 comprises 224 bytes of packet data and a 16-byte error-correcting code or syndrome. Although particular sizes and/or configurations of packets 610 and ECC codewords 620 are disclosed herein, the disclosure is not limited in this regard and could be adapted to use any size packets 610 and/or ECC codewords 620. Moreover, in some embodiments, the size of the datastructures (e.g., packets 610 and/or ECC codewords 620) may vary. For example, the size and/or contents of the packets 610 and/or ECC codewords 620 may be adapted according to out-of-service conditions, as disclosed above.

The data layout module 248 may be configured to lay out data for horizontal storage within rows 117 of the array 115. The data layout module 248 may be configured to buffer and/or arrange data segments (e.g., the ECC codewords 621, 622, and 623) into data rows 667 comprising 24 bytes of data. The data layout module 248 may be capable of buffering one or more ECC codewords 620 (by use of the write buffer 251). In the FIG. 6A embodiment, data layout module 248 may be configured to buffer 10 24-byte data rows, which is sufficient to buffer a full 240-byte ECC codeword 620.

The data layout module 248 may be configured to lay out data segments for horizontal storage within rows 117 of the array 115. The data layout module 248 may be configured to buffer and/or arrange data segments (e.g., the ECC codewords 621, 622, and 623) into data rows 667 comprising 24 bytes of data. The data layout module 248 may be capable of buffering one or more ECC codewords 620 (by use of the write buffer 251). In the FIG. 6A embodiment, data layout module 248 may be configured to buffer 10 24-byte data rows, which is sufficient to buffer a full 240-byte ECC codeword 620.

The data layout module 248 may be further configured to stream 24-byte data rows to a parity module 637, which may be configured to generate a parity byte for each 24-byte group. The data layout module 248 streams the resulting 25-byte data rows 667 to the array 115 via the bank controller 252 and interconnect 127 (and/or write buffer 250, as disclosed above). The storage controller 139 may be configured to stream the data rows 667 to respective program buffers of the solid-state storage array 115 (e.g., stream to program buffers of respective solid-state storage elements 116A-Y). Accordingly, each cycle of the interconnect 127 may comprise transferring a byte of a data row 667 to a program buffer of a respective solid-state storage element 116A-Y. In the FIG. 6A embodiment, on each cycle of the interconnect 127, the solid-state storage elements 116A-X receive data bytes of a data row 667 and solid-state storage element 116Y receives the parity byte of the data row 667.

As illustrated in FIG. 6A, data of the ECC codewords 620 (and packets 610) may be byte-wise interleaved between the solid-state storage elements 116A-X of the array 115; each solid-state storage element 116A-X receives 10 bytes of each 240 byte ECC codeword 620. As used herein, a data row 667 refers to a data set comprising data for each of a plurality of columns 118 within the array 115. The data row 667 may comprise a byte of data for each column 0-23. The data row 667 may further comprise a parity byte corresponding to the data bytes (e.g., a parity byte corresponding to the data bytes for columns 0-23). Data rows 667 may be streamed to respective program buffers of the solid-state storage elements 116A-Y via the interconnect 127. In the horizontal data configuration illustrated in FIG. 6A, streaming a 240-byte ECC codeword 620 to the array 115 may comprise streaming 10 separate data rows 667 to the array 115, each data row comprising 24 data bytes (one for each data solid-state storage element 116A-X) and a corresponding parity byte.

The storage locations of the solid-state storage array 115 may be capable of storing a large number of ECC codewords 610 and/or packets 610. For example, the solid-state storage elements may comprise 8 kb pages, such that the storage capacity of a storage location (row 117) is 192 kb. Accordingly, each storage location within the array 115 may be capable of storing approximately 819 240B ECC codewords (352 packets 610). The storage address of a data segment may, therefore, comprise: a) the address of the storage location on which the ECC codewords 620 and/or packets 610 comprising the data segment are stored, and b) an offset of the ECC codewords 620 and/or packets 610 within the row 117. The storage location or offset 636 of the packet 610A within the logical page 542A may be determined based on the horizontal layout of the data packet 610A. The offset 636 may identify the location of the ECC codewords 621, 622, and/or 623 comprising the packet 610A (and/or may identify the location of the last ECC codeword 623 comprising data of the packet 610A). Accordingly, in some embodiments, the offset may be relative to one or more datastructures on the solid-state storage array 115 (e.g., a packet offset and/or ECC codeword offset). Another offset 638 may identify the location of the last ECC codeword of a next packet 620 (e.g., packet 610B), and so on.

As depicted in FIG. 6A, each of the ECC codewords 621, 622, and 623 are horizontally spread across the storage elements 116A-Y comprising the logical page 542A (e.g., 10 bytes of the ECC codewords 621, 622, and 623 are stored on each solid-state storage element 116A-X). Accessing the packet 610A may, therefore, comprise accessing each of the ECC codewords 621, 622, and 623 (and each of the storage elements 116A-X).

Figure 6B:
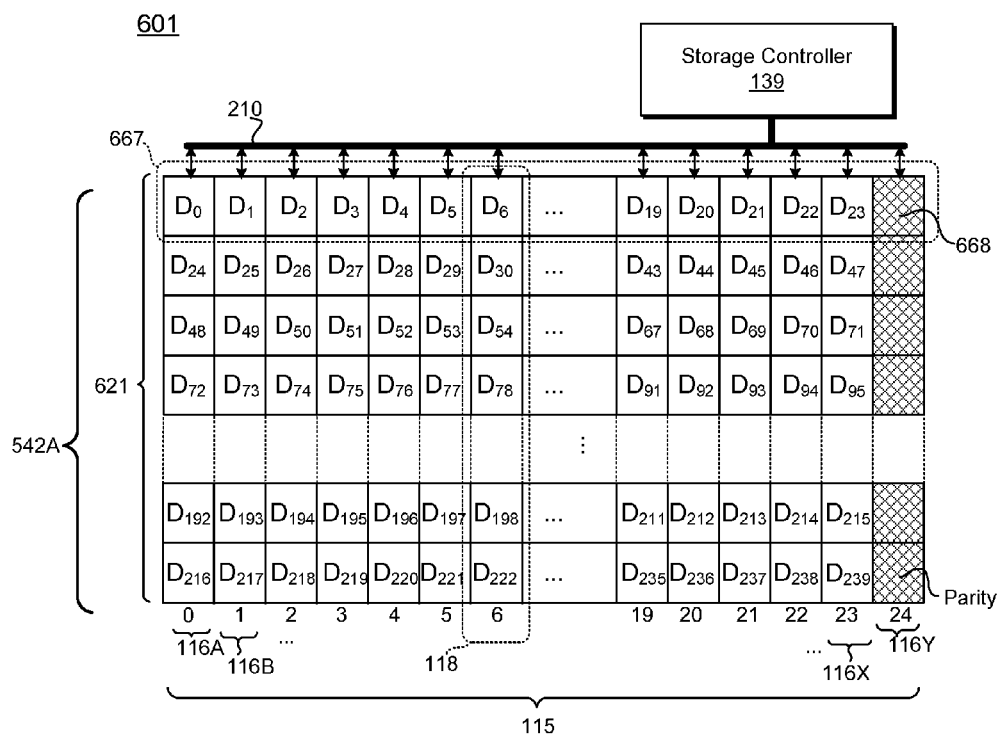
FIG. 6B depicts one embodiment of a horizontal data storage configuration.

FIG. 6B is a block diagram of a system 601 depicting one embodiment of a storage controller 139 configured to store data in a horizontal storage configuration. The FIG. 6B embodiment depicts a horizontal layout of an ECC codeword 621 on the array 115 of FIG. 6A. Data $D_0$ denotes a first byte of the ECC codeword 621, and data $D_{239}$ denotes the last byte (byte 240) of the ECC codeword 621. As illustrated in FIG. 6B, each column 118 of the solid-state storage array 115 comprises 10 bytes of the ECC codeword 621, and the data of the ECC codeword 621 is horizontally spread across a row 117 of the array 115 (e.g., horizontally spread across solid-state storage elements 116A-X of the array 115). FIG. 6B also depicts a data row 667 as streamed to (and stored on) the solid-state storage array 115. As illustrated in FIG. 6B, the data row 667 comprises bytes 0 through 23 of the ECC codeword D, each stored on a respective one of the columns 118. The data row 667 further comprises a parity byte 668 corresponding to the contents of the data row 667 (bytes $D_0$ through $D_{23}$).

Since the data is spread across the columns 0-23 (solid-state storage elements 116A-X), reading data of the ECC codeword 621 may require accessing a plurality of columns 118. Moreover, the smallest read unit may be an ECC codeword 620 (and/or packet 610). Referring back to FIG. 2, reading a data segment may comprise determining the storage address of the data by use of, inter alia, the translation module 134 (e.g., the forward map 152). The storage address may comprise a) the address of the storage location (logical page) on which the ECC codewords and/or packets comprising the requested data are stored, and b) the offset of the ECC codewords and/or packets within the particular storage location. Referring to FIG. 1B, the translation module 134 may be configured to maintain a forward map 152 configured to index front-end identifiers to storage addresses on the storage medium 140. As disclosed above, the storage address of data may comprise a) the address of the storage location (logical page) comprising the data and b) an offset of the data within the storage location. Accordingly, the storage addresses 156A-D of the entries 153 within forward map 152 may be segmented into a first portion comprising an address of a storage location and a second portion comprising the offset of the data within the storage location.

Portions of the storage metadata 135, including portions of the forward map 152, may be stored in volatile memory of the computing system 100 and/or storage layer 130. The memory footprint of the storage metadata 135 may grow in proportion to the number of entries 153 that are included in the forward map 152, as well as the size of the entries 153 themselves. The memory footprint of the forward map 152 may be related the size (e.g., number of bits) used to represent the storage address of each entry 153. The memory footprint of the forward map 153 may impact the performance of the computing system 100 hosting the storage layer 130. For example, the computing device 100 may exhaust its volatile memory resources 102, and be forced to page swap memory to non-volatile storage resources 103, or the like. Even small reductions in the size of the entries 153 may have a significant impact on the overall memory footprint of the storage metadata 135 when scaled to a large number of entries 153.

The number of the storage addresses 154A-D may also determine the storage capacity that the forward map 152 is capable of referencing (e.g., may determine the number of unique storage locations that can be referenced by the entries 153 of the forward map 152). In one embodiment, for example, the entries 153 may comprise 32 bit storage addresses 154A-D. As disclosed above, a portion of each 32 bit storage addresses 154A-D may be used to address a specific storage location (e.g., logical page), and other portions of the storage addresses 154A-D may determine the offset within the storage location. If 4 bits are needed to represent storage location offsets, the 32 bit storage addresses 154A-D may only be capable of addressing $2^{28}$ unique storage locations. However, if offset information is stored on non-volatile storage media (e.g., on the logical pages themselves), the full 32 bits of the physical address may be used to reference unique logical pages. Therefore, a 32 bit address may address $2^{32}$ unique logical pages rather than only $2^{28}$ logical pages. Accordingly, segmenting storage addresses may effectively increase the number of unique storage locations that can be referenced by the forward map 152.

Referring to FIG. 2, in some embodiments, the storage layer 130 comprises an offset index module 249 configured to determine the offsets of data segments within storage locations of the storage medium 140. The offset index module 249 may be further configured to generate an offset index configured to map front-end identifiers of the data segments to respective offsets within the storage locations. The offset index may be configured for storage on the storage medium 140. The offset index module 249 may, therefore, segment storage addresses into a first portion configured to address a storage location (logical page) on the storage medium 140, and a second portion corresponding to an offset within the storage location. The storage controller 139 may be configured to store the offset index (the second portion of the storage addresses) on the storage medium 140. The translation module 134 may be configured to index front-end addresses of the data using the first portion of the storage addresses. The second portion of the storage addresses may be omitted from the forward map 152, which may reduce the memory overhead of the forward map 152 and/or enable the forward map 152 to reference a larger storage address space 144.

Figure 7A:
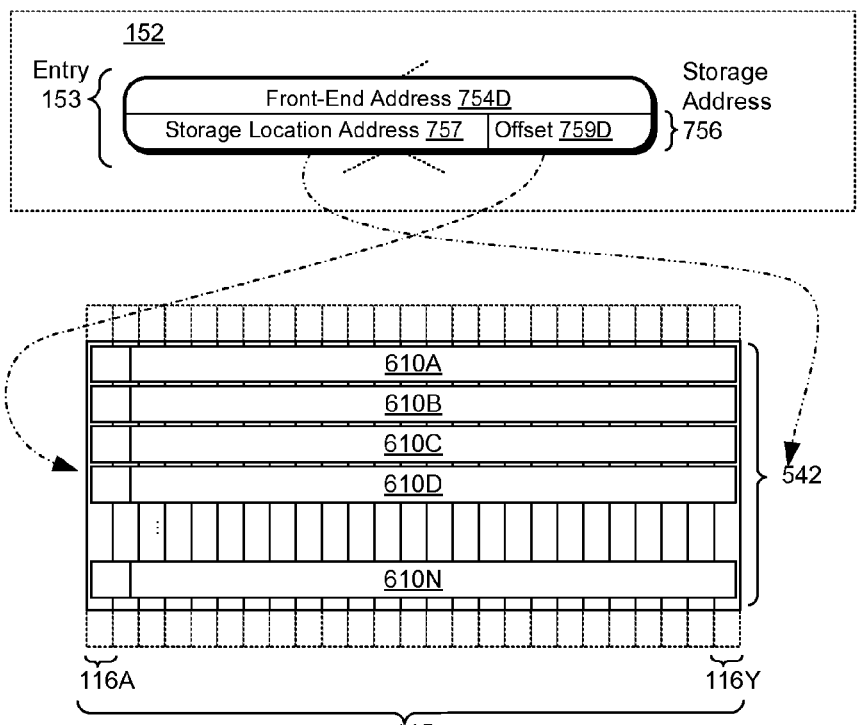
FIG. 7A depicts one embodiment of storage metadata for referencing data stored on a storage medium.

FIG. 7A depicts one embodiment of a system 700 for referencing data on a storage medium. The system 700 comprises a forward map 152 that includes an entry 153 configured to associate a front-end address 754D with a storage address 756. Other entries 153 of the forward map 152 are omitted from FIG. 7A to avoid obscuring the details of the depicted embodiments. The offset index module 249 may segment the storage address into a first portion 757 and a second portion 759D. The first portion 757 may correspond to an address of a storage location and the second portion 759D may identify an offset of the data segment within the storage location (e.g., within a logical page 542). The relative size of the offset portion 759D of the storage address 756 to the storage location portion 757 may be based on the size of the data packets 610A-N stored on the solid-state storage array 115, the size of the logical page 542, and/or the layout of the packets 610A-N within the array 115. In the FIG. 7A embodiment, the logical pages 542 may be used in a "24+1" horizontal storage configuration, comprising 24 data columns and a parity column, such that the physical storage capacity of the logical pages 542 within the array 115 is 24 times larger than the page size of the solid-state storage elements 116A-Y (e.g., 192 kb for solid-state storage elements 116A-Y comprising 8 kb pages). Accordingly, each logical page 542 may be capable of storing a relatively large number of data segments and/or packets 610A-N. The disclosure is not limited in this regard, however, and could be adapted for use with any number of solid-state storage elements 116A-Y having any suitable page size, storage configuration, and/or data layout.

The data segment mapped to the front-end address 754 may be stored in the packet 610D. The storage location address 757 (first portion of the storage address 756) comprises the media address of the logical page 542 within the array 115. The offset 759D indicates an offset of the packet 610D within the logical page 542.

Figure 7B:
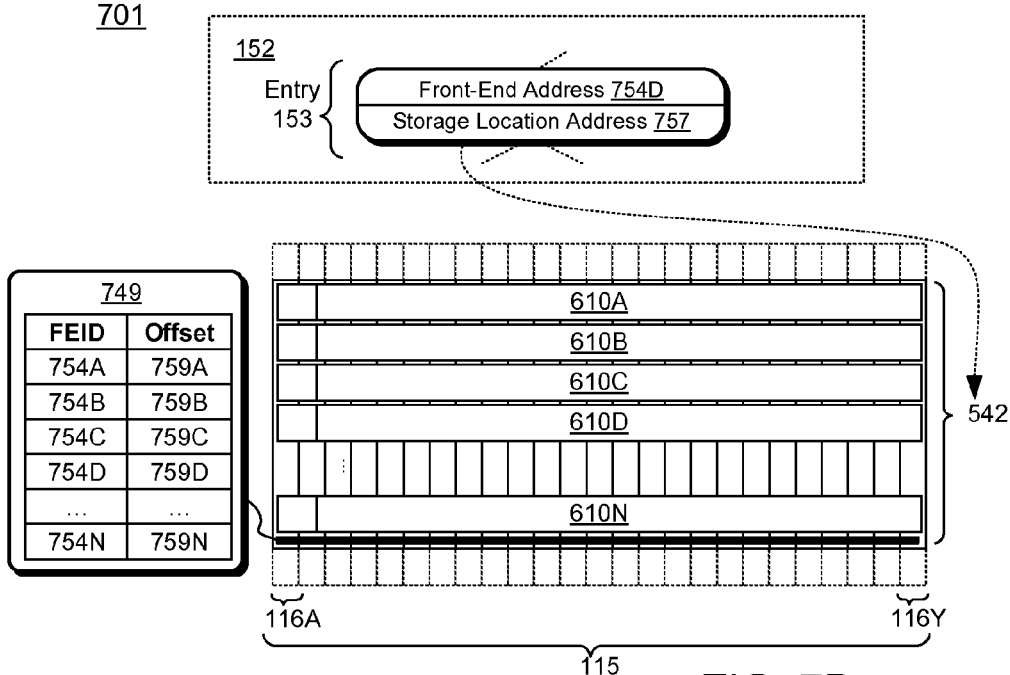
FIG. 7B depicts another embodiment of storage metadata for referencing data stored on a storage medium.

Referring to the system 701 of FIG. 7B, the offset index module 249 may be configured to determine the offset of the packet 610D within the logical page 542 (as the packet 610D is stored on the storage medium 140). The offset index module 249 may be further configured to generate an offset index 749 configured for storage on the storage medium 140.

The offset index 749 may comprise mappings between front-end identifiers 754A-N of the data segments stored on the logical page 542 and the respective offsets of the data segments within the logical page 542 (e.g., the offsets of the data packets 610A-N comprising the data segments). The storage layer 130 may be configured to store the offset index 749 on the storage medium 140. As illustrated in FIG. 7B, the offset index 749 is stored on the corresponding storage location 542 (on the same logical page 542 comprising packets 610A-N indexed by the offset index 749). Alternatively, the offset index 749 may be stored on a different storage location.

The storage layer 130 may be configured to leverage the on-media offset index 749 to reduce the size of the entries 153 in the forward map 152 and/or enable the entries 153 to reference larger storage address spaces 144. As illustrated in FIG. 7B, the entry 153 may include only the first portion (storage location address 757) of the storage address 756. The storage layer 130 may be configured to omit and/or exclude the second portion of the address (the offset portion 759D) from the index entries 153.

The storage layer 130 may determine the full storage address of a data segment by use of the storage location address 757 maintained within the forward map 152 and the offset index 749 stored on the storage medium 140. Accordingly, accessing data associated with the front-end address 754D may comprise a) accessing the storage location address 757 within the entry 153 corresponding to the front-end address 754D in the forward map 152, b) reading the offset index 749 from the logical page 542 at the specified storage location address 757, and c) accessing the packet 610D comprising the data segment at offset 759D by use of the offset index 749.

Figure 7C:
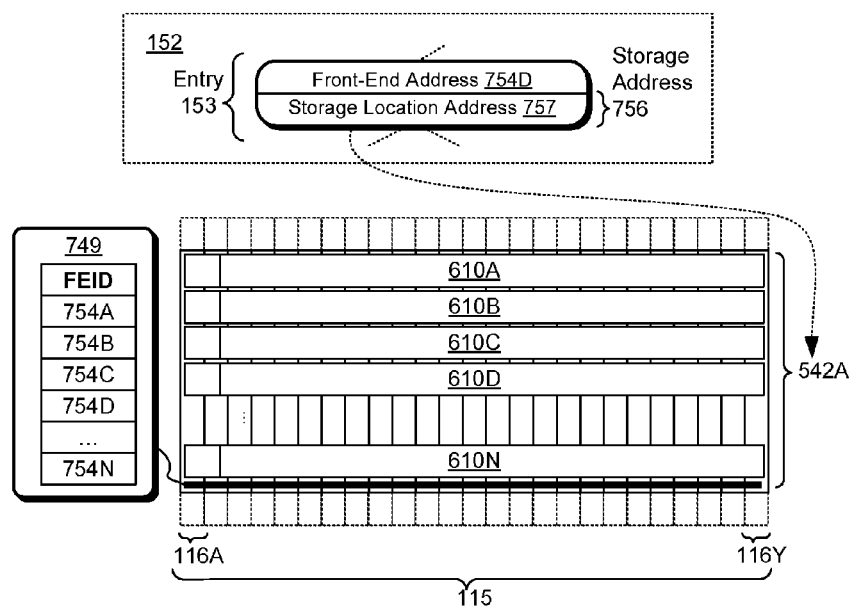
FIG. 7C depicts another embodiment of storage metadata for referencing data stored on a storage medium.

Referring to the system 702 of FIG. 7C, in some embodiments, the storage layer 130 may be configured to store data packets 610A-N that are of a fixed, predetermined size. Accordingly, the offset of a particular data packet 610A-N may be determined based on its sequential order within the logical page 542. In such embodiments, the offset index module 249 may generate an offset index 749 comprising an ordered list of front-end identifiers 754A-N, which omits the specific offsets of the corresponding data packets 610A-N. The offsets of the fixed-sized data packets 610A-N may be determined based on the order of the front-end identifiers 754A-N. In another embodiment, the offset index 749 may comprise an offset of the first data packet 610A in the logical page 542, and may omit offsets of the subsequent packets 610B-N. In other embodiments, the offset index 749 may comprise offsets to other datastructures within the storage location, such as the offset of particular ECC codewords 620, as disclosed herein. The offsets may be derived from the offset index 749 using any suitable mechanism. In some embodiments, for example, the logical page 542 may store data structures having a variable size; the offset index 749 may be configured to list the front-end identifiers of the data structures along with a length or size of each data structure. In another embodiment, the logical page 542 may be segmented into a plurality of fixed-sized "chunks," and the data of a front-end identifier may occupy one or more of the chunks. In such embodiments, the offset index 749 may comprise a bitmap (or other suitable data structure) indicating which chunks are occupied by data of which front-end identifiers.

As illustrated in FIGS. 7B and 7C, the storage controller 139 may be configured to append the offset index to the "tail" of the logical page 542. The disclosure is not limited in this regard, however, and could be adapted to store the offset index 749 at any suitable location within the logical page 542 and/or on another storage location of the storage medium 140.

Referring back to FIG. 2, the offset index module 249 may be configured to determine the offset of data segments, and the data segments are stored on the storage medium 140. Determining offsets of the data segments may comprise determining the offset of one or more data packets 610 and/or ECC codewords 620 comprising the segments, as disclosed above. Determining the offsets may further comprise monitoring the status of the write buffer 250, OOS conditions within one or more of the solid-state storage arrays 115A-N, and so on. The offset index module 249 may be further configured to generate an offset index 749 for storage on the storage medium 140. The offset index 749 may be stored at a predetermined location (e.g., offset) within the storage location that the offset index 749 describes. The offset index 249 may flow into the write buffer 250 and onto program buffers of a corresponding solid-state storage array 115A-N, as disclosed herein. The data segments (data packets 610 and/or ECC codewords 620) and the offset index 749 may be written onto a storage location within one of the arrays 115A-N in response to a program command, as disclosed herein. The translation module 134 may be configured to omit offset information from the index 152, as disclosed herein.

Reading data corresponding to a front-end address may comprise accessing an entry 153 associated with the front-end address to determine the physical address of the storage location comprising the requested data. The read module 241 may be configured to read the storage location by, inter alia, issuing a read command to one of the solid-state storage arrays 115A-N, which may cause the storage elements 116A-Y comprising the array 115A-N to transfer the contents of a particular page into a read buffer. The offset index module 249 may be configured to determine the offset of the requested data by a) streaming the portion of the read buffer 251 comprising the offset index 749 into the read module 241 and b) parsing the offset index 749 to determine the offset of the requested data. The read module 241 may then access the portions of the read buffer 251 comprising the requested data by use of the determined offset.

As disclosed herein, the packet module 244 may be configured to store data segments 312 in a packet format 310 that comprises persistent metadata 314. The persistent metadata 314 may comprise one or more front-end identifiers 315 corresponding to the data segment 312. Inclusion of the front-end interface metadata 315 may increase the on-media overhead imposed by the packet format 310. The offset index 749 generated by the offset index module 249, which, in some embodiments, is stored with the corresponding data packets, may also include the front-end interface of the data segment 312. Accordingly, in some embodiments, the packet format 310 may be modified to omit front-end interface metadata from the persistent metadata 314.

Referring back to FIGS. 6A and 6B, the horizontal data configuration implemented by the data layout module 248 may spread ECC codewords 620 (and the corresponding packets 610 and/or data segments) across the columns 0-23 (solid-state storage elements 116A-X). As such, reading data of the ECC codeword 621 may require accessing a plurality of columns 118. Moreover, the smallest read unit may be an ECC codeword 620 (and/or packet 610). Reading a packet 310 stored horizontally on the solid-state storage array 115 may, therefore, incur significant overhead. Referring back to FIG. 6A, reading the packet 610A may require transferring data of the logical page 542A into respective read buffers of the storage elements 116A-X (e.g., storage elements 0 through 23). Transferring the contents of a page into the read buffer may incur a latency of Tr (read latency). As used herein, read time or read latency Tr refers to the time needed to transfer the contents of a physical storage unit (e.g., physical page) into a read buffer of a solid-state storage element 116A-Y. In the FIG. 6A embodiment, the read time Tr may, therefore, refer to the time required to transfer a physical page of each of the solid-state storage elements 116A-X into a respective read buffer. Accordingly, the read time Tr of a logical storage unit 650 may correspond to the "slowest" read time of the constituent storage elements 116A-X.

The read module 241 may be configured to perform a read operation to read a storage location of one of the solid-state storage arrays 115A, transfer the contents of the storage location into respective read buffers of the solid-state storage elements 116A-Y, and stream the data into the read buffer 251 by use of the 24-byte interconnect 127 and/or bank controller 252. The stream time (Ts) of the read operation may refer to the time required to stream the ECC codewords 620 (and/or packets 610) into the read module 241. In the horizontal data layout of FIG. 6A, the stream time Ts may be 10 cycles of the interconnect 127 because, as disclosed above, each column 118 of the array 115 comprises 10 bytes of the ECC codeword 620. Therefore, although the horizontal arrangement may incur a relatively high retrieval overhead, the stream overhead is relatively low (only 10 cycles).

Given the horizontal data arrangement within the solid-state storage array 115, and the latencies disclosed herein, an input/output operations per second (IOPS) metric may be quantified. The IOPS to read an ECC codeword 620 may be expressed as:

$$IOPS_r = \frac{C}{(Tr+Ts)} \qquad \text{Eq. 1}$$

In Equation 1, Tr is the read time of the solid-state storage elements 116A-Y, Ts is the stream time (e.g., the clock speed times the number of cycles required), and C is the number of independent columns 118 used to store the data. Equation 1 may be scaled by the number of independent banks 119A-N available to storage layer 130. In the horizontal data structure layout of FIGS. 6A and 6B, Equation 1 may be expressed as:

$$IOPS_r = \frac{24}{(Tr+10*Sc)} \qquad \text{Eq. 2}$$

In Equation 2, the number of columns is twenty-four (24), and Sc is the cycle time of the bus 127. The cycle time is scaled by 10 since, as disclosed above, a horizontal 240-byte ECC codeword 620 may be streamed in 10 cycles of the interconnect 127.

The storage layer 130 may be configured to store data in different configurations, layouts, and/or arrangements within a solid-state storage array 115. As disclosed above, in some embodiments, the data layout module 248 is configured to arrange data within respective independent columns, each comprising a subset of the columns 118 of the array 115 (e.g., subsets of the solid-state storage elements 116A-Y). Alternatively, or in addition, the data layout module 248 may be configured to store data vertically within respective "vertical stripes." The vertical stripes may have a configurable depth, which may be a factor of the page size of the solid-state storage elements 116A-Y comprising the array 115.

Figure 8A:
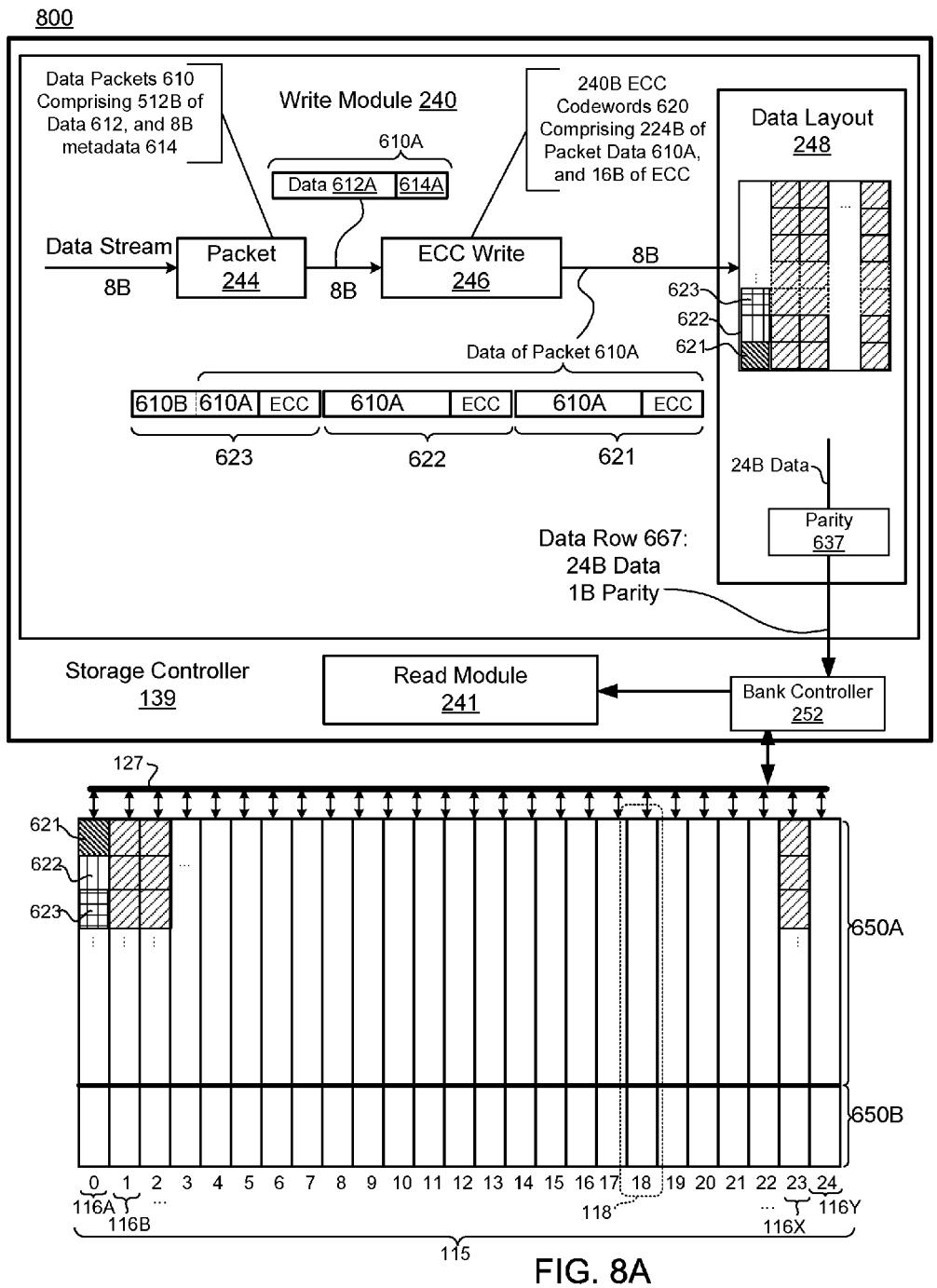
FIG. 8A depicts one embodiment of a vertical data layout.

FIG. 8A depicts another embodiment of a system 800 for referencing data on a storage medium 140. In the FIG. 8A embodiment, the data layout module 248 is configured to store data in a vertical layout within the array 115. The data write module 240 may be configured to buffer ECC codewords 620 for storage on respective columns 118 of the solid-state storage array 115 (including the ECC codewords 621, 622, and 623 disclosed herein). The ECC codewords 620 may be streamed to respective columns 118 of the array 115 through a write buffer 250, as disclosed above. Accordingly, each cycle of the interconnect 127 may comprise streaming a byte of a different respective ECC codeword 610 to each of the columns 116A-X. The write module 240 may be further configured to generate parity data 637 corresponding to the different ECC codewords 620 for storage on a parity column (e.g., solid-state storage element 116Y). Accordingly, each stream cycle may comprise streaming a byte of a respective ECC codeword 620 to a respective column 118 along with a corresponding parity byte to a parity column 118.

As depicted in FIG. 8A, the data layout module 248 may be configured to buffer and rotate ECC codewords for vertical storage within respective columns 118 of the array 115: the ECC codewords 621, 622, and 623 comprising the data segment 612A may stream to (and be stored vertically on) column 0 (solid-state storage element 116A), other ECC codewords 620 comprising other data segments may be stored vertically within other columns 118 of the array 115. Solid-state storage element 116Y may be configured to store parity data corresponding to the ECC codewords, as disclosed above. Alternatively, the parity column 24 may be used to store additional ECC codeword data.

In some embodiments, the storage controller 139 may comprise a plurality of packet modules 242 and/or ECC write modules 246 (e.g., multiple, independent write modules 240) configured to operate in parallel. Data of the parallel write modules 240 may flow into the data layout module 248 in a checkerboard pattern such that the data is arranged in the vertical format disclosed herein.

The vertical arrangement of FIG. 8A may comprise the data layout module 248 arranging ECC codewords 620 for storage within respective columns 118 of the array 115. Accordingly, each data row 667 streamed to the array 115 may comprise a byte corresponding to a respective ECC codeword 620. The data row 667 may further comprise a corresponding parity byte; the data rows 667 may be configured to stream data of respective ECC codewords 620 to program buffers of respective data columns (e.g., solid-state storage elements 116A-Y), and a corresponding parity byte to a parity column (e.g., column 116Y). Accordingly, the data rows 667 may be stored with byte-wise parity information, each byte of a row 667, and stored within the solid-state storage elements 116A-X, may be reconstructed by use of the other bytes in the row 667 (and stored in other solid-state storage elements 116A-X) and the corresponding parity byte.

Figure 8B:
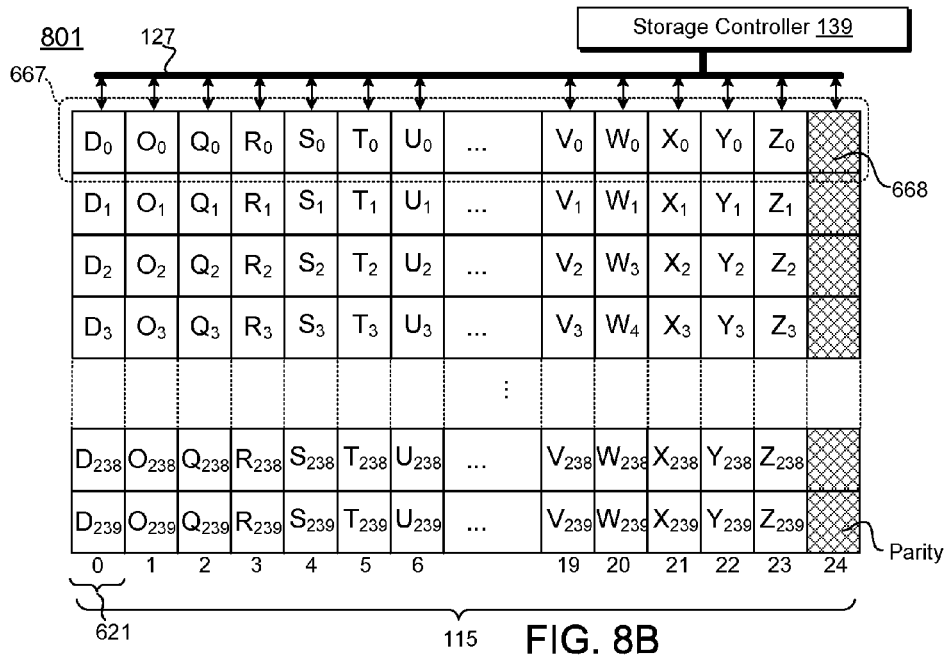
FIG. 8B depicts another embodiment of a vertical data layout.

FIG. 8B depicts another embodiment of system 801 for referencing data on a storage medium. FIG. 8B depicts one embodiment of a vertical data arrangement within a solid-state storage array 115. The FIG. 8B embodiment illustrates a vertical storage configuration within the solid-state storage array 115. As illustrated in FIG. 6D, data $D_0$ through $D_{239}$ of the ECC codeword 621 is stored vertically in column 0, Data $D_0$ through $D_{239}$ of another ECC codeword 620 is stored vertically in column 1, Data $Q_0$ through $Q_{239}$ of another ECC codeword 620 is stored vertically in column 2, and data $Z_0$ through $Z_{239}$ of another ECC codeword 620 is stored vertically in column 23. The vertical storage configuration of other data of other ECC codewords 620 (R-Y) is also depicted.

FIG. 8B also depicts one embodiment of a data row 667 as streamed to, and stored on, the solid-state storage array 115. As illustrated in FIG. 8B, the data row 667 comprises a byte of each of a plurality of ECC codewords 620 (ECC codewords D, O, R, S, T, U . . . V, W, X, Y, and Z), each of which is streamed to, and stored within, a respective column 118 (respective solid-state storage element 116A-X). The data row 667 further comprises a parity byte 668 corresponding to the data within the data row 667. Accordingly, the parity byte 668 corresponds to byte 0 of ECC codewords D, O, R, S, T, U . . . V, W, X, Y, and Z.

The vertical data layout of FIGS. 8A-B may result in a different IOPS metric. The vertical arrangement of the ECC codewords 620 may reduce overhead due to read time Tr, but may increase the stream overhead Ts. As data is streamed from a logical storage element 116A-Y, each byte on the bus 127 may correspond to a different, respective data segment (e.g., different ECC codeword 620). As such, 24 different ECC codewords 620 may be streamed in parallel (as opposed to streaming a single ECC codeword 620 as in the horizontal arrangement example). Moreover, since each column may be independently addressable, each transferred logical page may comprise data of a separate request (e.g., may represent data of 24 different read requests). However, since each ECC codeword 620 is arranged vertically, the stream time Ts for an ECC codeword 620 may be increased; the stream time of 240-byte ECC codewords 620 in a vertical configuration may be 240 cycles, as opposed to 10 cycles in the fully horizontal layout of FIGS. 6A and 6B. The IOPS metric for a single ECC codeword 620, therefore, may be represented as:

$$IOPS_r = \frac{1}{(T_r + 240 * S_c)} \quad \text{Eq. 3}$$

The reduced IOPS metric may be offset by the increased throughput (reduced read overhead) and/or different Tr and Ts latency times. These considerations may vary from device to device and/or application to application. Moreover, the IOPS metric may be ameliorated by the fact that multiple, independent ECC codewords 620 can be streamed simultaneously. Therefore, in some embodiments, the data layout used by the storage layer 130 (and data layout module 248) may be configurable (e.g., by a user setting or preference, firmware update, or the like).

Figure 8C:
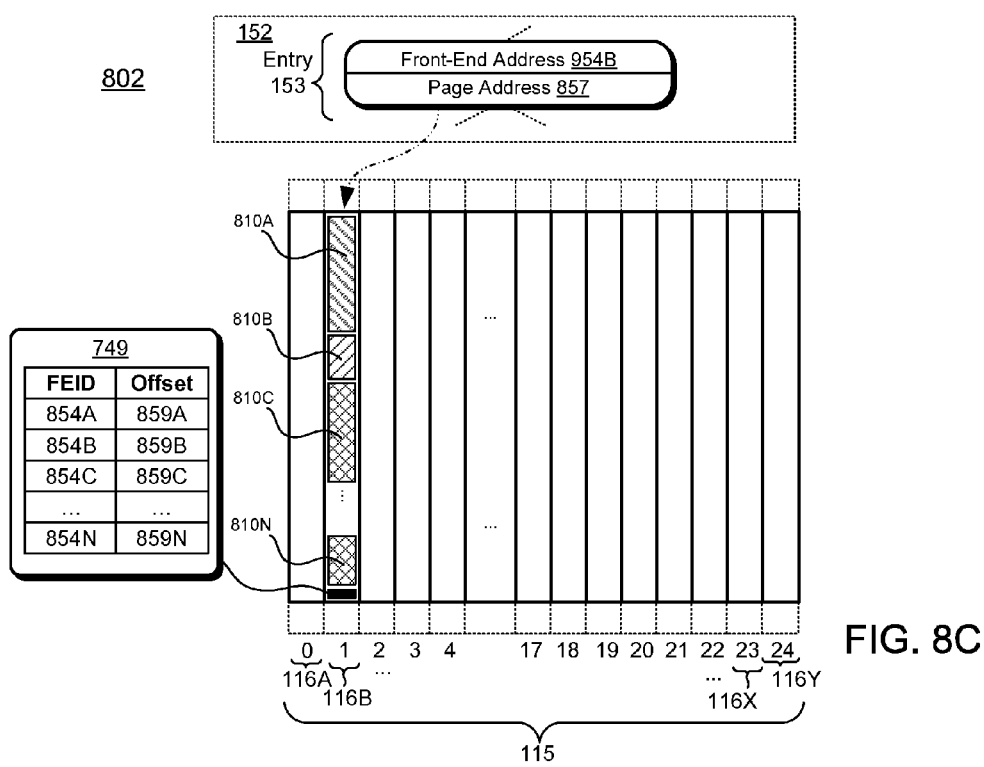
FIG. 8C depicts one embodiment of a system for referencing data stored on a storage medium in a vertical data layout.

The pages of the solid-state storage elements 116A-Y may be capable of storing a large number of ECC codewords 620 and/or data packets 610. Accordingly, the vertical data arrangement of FIGS. 8A-B may comprise storing ECC codewords 620 and/or data packets 610 corresponding to different front-end addresses within the same columns 118 of the array. FIG. 8C depicts one embodiment of a system 802 for referencing data stored in a vertical data layout. The offset index module 249 may be configured to segment the storage addresses into a first portion 1057 that identifies the vertical column 118 comprising the data (e.g., the particular page(s) comprising the data segment) and a second portion that identifies the offset of the data segments within the vertical column 118. As illustrated in FIG. 8C, the packet 810C comprising the data segment corresponding to front-end address 854B is stored in a vertical data arrangement within a page of solid-state storage element 116B. The offset index module 249 may be configured to determine the offsets of the packets stored within the page, and to generate an offset index 749 that maps the front-end identifiers of the packets 810A-N to respective offsets 859A-N of the packets within the vertical data arrangement within the page. The storage controller 139 may be configured to store the offset index 749 within the page comprising the packets 810A-N indexed thereby. In the FIG. 8C embodiment, the packets 810A-N are of variable size and, as such, the offset index 749 may associate front-end identifiers 854A-N with respective offsets 859A-N. In other embodiments comprising packets 810A-N that are of a fixed size, the offsets 859A-N may be inferred from the order of the packets within the vertical column arrangement.

The forward map 152 may be configured to index front-end identifiers to pages of respective solid-state storage elements 116A-Y. Accordingly, the forward map 152 may include a subset of the full storage address 1057 (the portion of the address that identifies the particular page comprising the data segment), and may omit addressing information pertaining to the offset of the data segment within the page. The storage layer 130 may be configured to access the data segment corresponding to front-end address 854B by: a) identifying the page comprising the data segment associated with the front-end address 854B by use of the forward map 152; b) reading the identified page; c) determining the offset of the data packet 810B by use of the offset index 749 stored on the identified page; and d) reading the packet 810B at the determined offset.

Figure 9A:
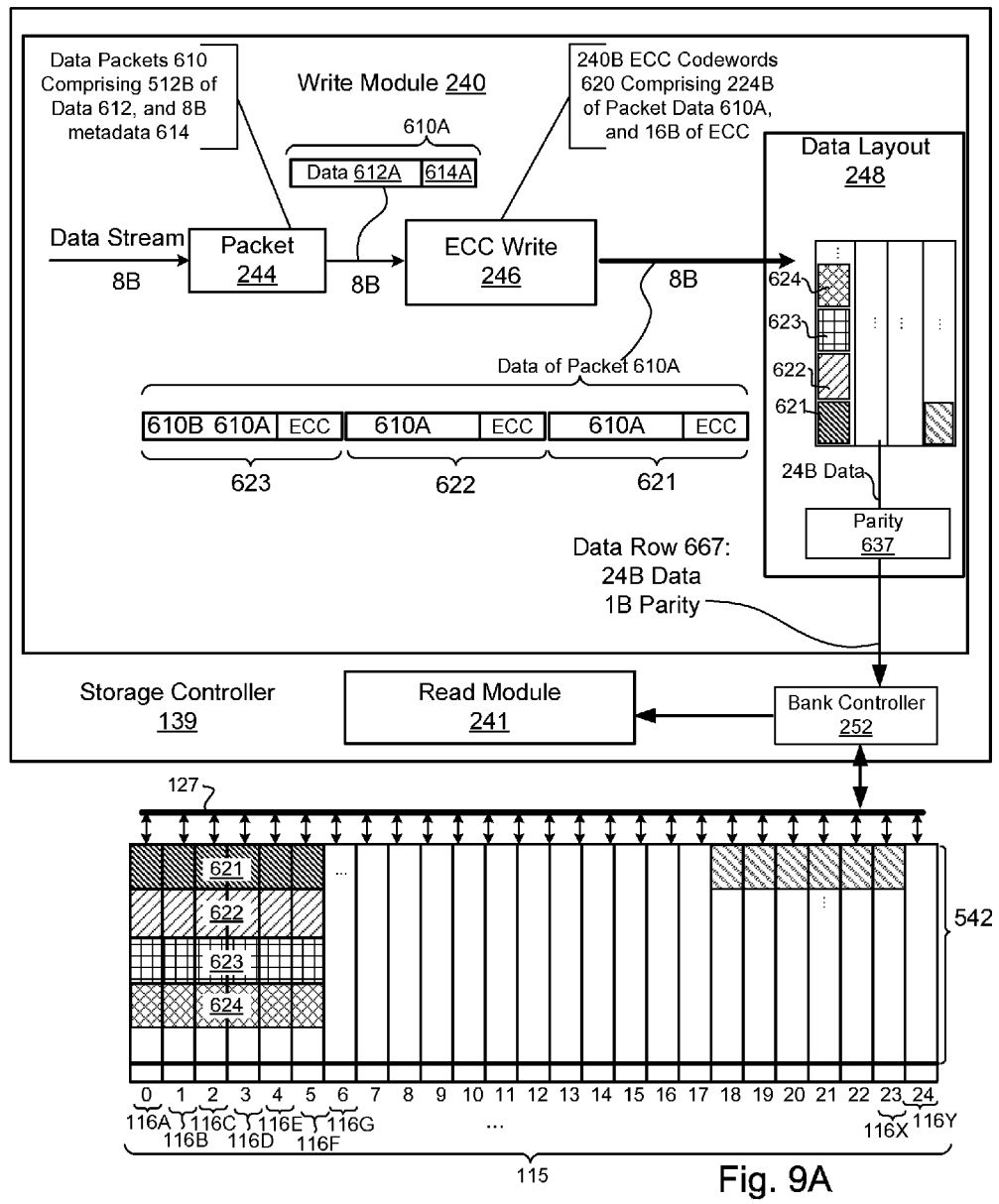
FIG. 9A is a block diagram of one embodiment of a system for referencing data stored in an independent column layout on a storage medium.

In some embodiments, the data layout module 248 may be configured to lay out and/or arrange data in an adaptive channel configuration. As used herein, an adaptive channel configuration refers to a data layout in which the columns 118 of the array 115 are divided into a plurality of independent channels, each channel comprising a set of columns 118 of the solid-state storage array 115. The channels may comprise subsets of the solid-state storage elements 116A-Y. In some embodiments, an adaptive channel configuration may comprise a fully horizontal data layout, in which data segments are stored within a channel comprising 24 columns 118 of the array 115, as disclosed in conjunction with FIGS. 6A-B and 7A-C. In other embodiments, the adaptive channel configuration may comprise a vertical configuration, in which data segments are stored within one of 24 different channels, each comprising a single column 118 of the array 115, as disclosed in conjunction with FIGS. 10A-C. In other embodiments, the data layout module 248 may be configured to store data in other adaptive channel configurations and/or layouts on the solid-state storage array 115. FIG. 9A depicts another embodiment of a system 900 for adaptive data storage. In the FIG. 9A embodiment, the data layout module 248 is configured to store data structures in adaptive channels comprising six solid-state storage elements 116A-Y (six independent columns 118 per channel). Accordingly, data segments may be stored within respective independent channels, each comprising size columns 118 of the array 115. In the FIG. 9A embodiment, the data layout module 248 may be configured to buffer four ECC codewords 620 to stream to the array 115. Each of the four ECC codewords 621, 622, 623, and 624 may stream to a respective set of six columns 118 within the array 115.

In alternative adaptive channel configurations, the data layout module 248 may be configured to buffer 24/N ECC codewords 620, where N corresponds to the configuration of the adaptive channels used for each ECC codeword 620. ECC codewords 620 may be stored within independent channels comprising N columns 118 (e.g., N solid-state storage elements 116A-Y). Accordingly, the horizontal arrangement of FIGS. 6A-B could be referred to as an adaptive channel configuration comprising 24 column independent channels, and the vertical data structure configuration of FIGS. 8A-C could be referred to as an adaptive channel configuration comprising independent channels comprising a single column 118. The storage controller 139 may be configured to arrange data in any suitable hybrid arrangement, including heterogeneous sets of independent channels. In some embodiments, for example, the data layout module 248 may be configured to buffer two ECC codewords 620 in a 12-column adaptive channel configuration (e.g., store ECC codewords 620 across each of 12 columns 118), buffer six ECC codewords 620 in a four-column adaptive channel configuration (e.g., store ECC codewords 620 across each of four columns 118), and so on.

In some embodiments, data segments may be arranged in adjacent columns 118 within the array 115 (e.g., a data structure may be stored in columns 0-4). Alternatively, columns may be non-adjacent and/or interleaved with other data segments (e.g., a data segment may be stored on columns 0, 2, 4, and 6 and another data segment may be stored on columns 2, 3, 5, and 7). The data layout module 248 may be configured to adapt the data layout in accordance with out-of-service conditions within the array 115; if a column 118 (or portion thereof) is out of service, the data layout module 238 may be configured to adapt the data layout accordingly (e.g., arrange data to avoid the out of service portions of the array 115, as disclosed above).

Figure 9B:
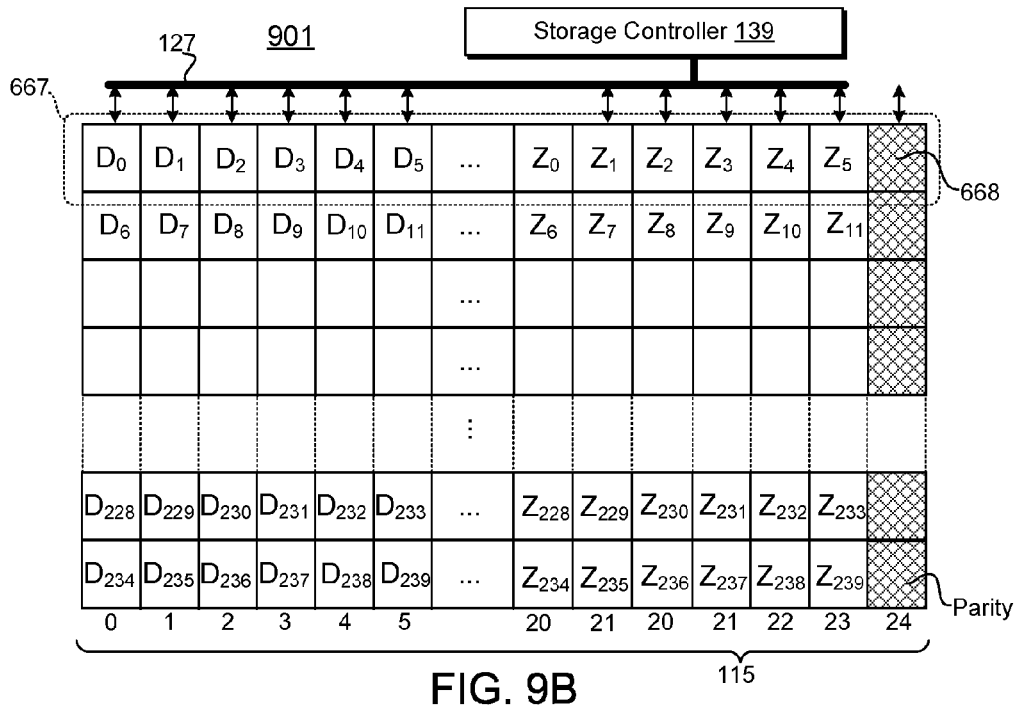
FIG. 9B is a block diagram of another embodiment of a system for referencing data stored in an independent column layout on a storage medium.

FIG. 9B depicts another embodiment 901 of a six column independent channel data layout. As illustrated in FIG. 9B, data of an ECC codeword (data $D_{0-239}$) may be stored within a channel comprising columns 0-5 of the array 115 and data of another ECC codeword (data $Z_{0-239}$) may be stored within an independent channel comprising columns 20-23, and so on. FIG. 9B further depicts a data row 667, which includes six bytes of four different ECC codewords, including D and Z (bytes D0-5 and Z0-5). The data row 667 may further comprise a parity byte 668 corresponding to the contents of the data row 667, as disclosed above.

The stream time Ts of an ECC codeword 620 in the independent channel embodiments of FIGS. 9A-B may be 40 cycles of the bus 127 (e.g., 240/N cycles). An IOPS metric of a six independent column data layout may be represented as:

$$IOPS_r = \frac{6}{(T_r + 40 * S_c)} \qquad \text{Eq. 4}$$

The IOPS metric may be modified according to a number of data segments that can be read in parallel. The six-column independent channel configuration may enable four different ECC codewords (and/or packets) to be read from the array 115 concurrently.

Figure 9C:
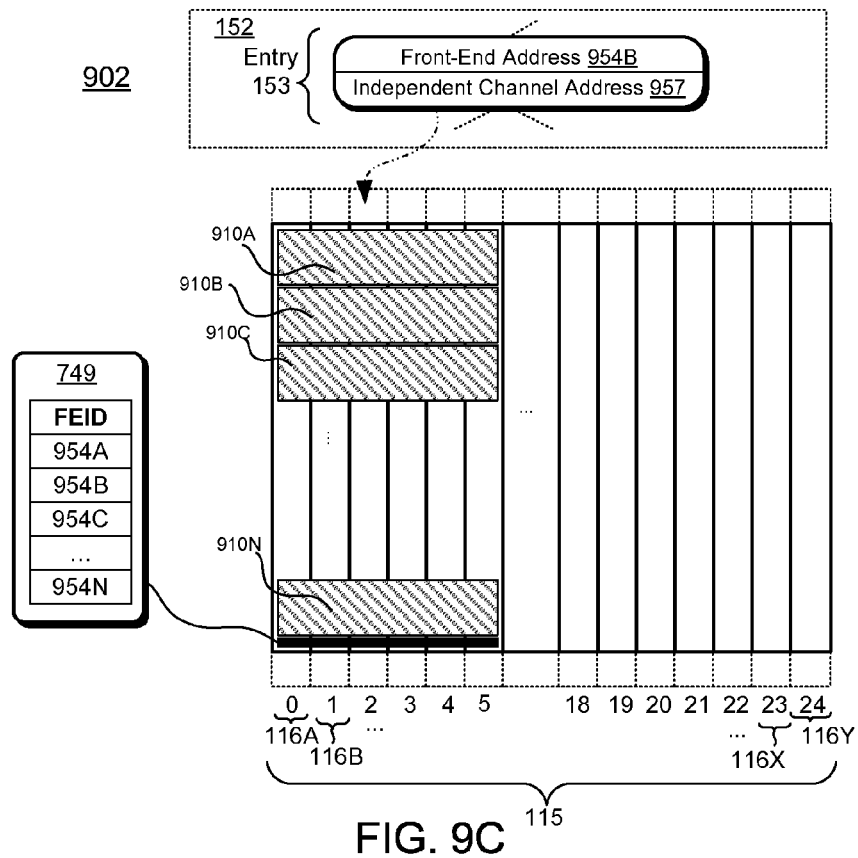
FIG. 9C is a block diagram of another embodiment of a system for referencing data stored in an independent column layout on a storage medium.

FIG. 9C depicts another embodiment of a system 902 for referencing data stored in an adaptive, independent channel layout. In the FIG. 9C embodiment, data packets 910A-N comprising respective data segments are stored in independent channels comprising six columns 118 of the array 115, such that each independent channel comprises six solid-state storage elements 116A-Y. The offset index module 248 may be configured to segment the storage addresses of the data packets 910A-N into a first portion comprising the physical address 957 of an independent channel, which may correspond to a page address on each of six solid-state storage elements. In the FIG. 9C embodiment, the independent channel address 957 corresponds to a page on solid-state storage elements 0-5. The second portion of the storage address may correspond to offsets of the data packets 910A-N within the independent channel. The offset index module 248 may be configured to generate an offset index 749 configured to map front-end addresses 954A-N to corresponding offsets within the independent channel 957. The data packets 910A-N may be of fixed size and, as such, the offset index 749 may indicate the order of the data packets 910A-N within the independent channel as opposed to specifying particular offsets.

In some embodiments, the storage layer 130 may be configured to store data in an adaptive vertical stripe configuration. As used herein, a vertical stripe configuration refers to storing data structures vertically within vertical stripes having a predetermined depth within the columns 118 of the solid-state storage array. Multiple vertical stripes may be stored within rows 117 of the array 115. The depth of the vertical stripes may, therefore, determine read-level parallelism, whereas the vertical ECC configuration may provide error detection, correction, and/or reconstruction benefits.

Figure 10A:
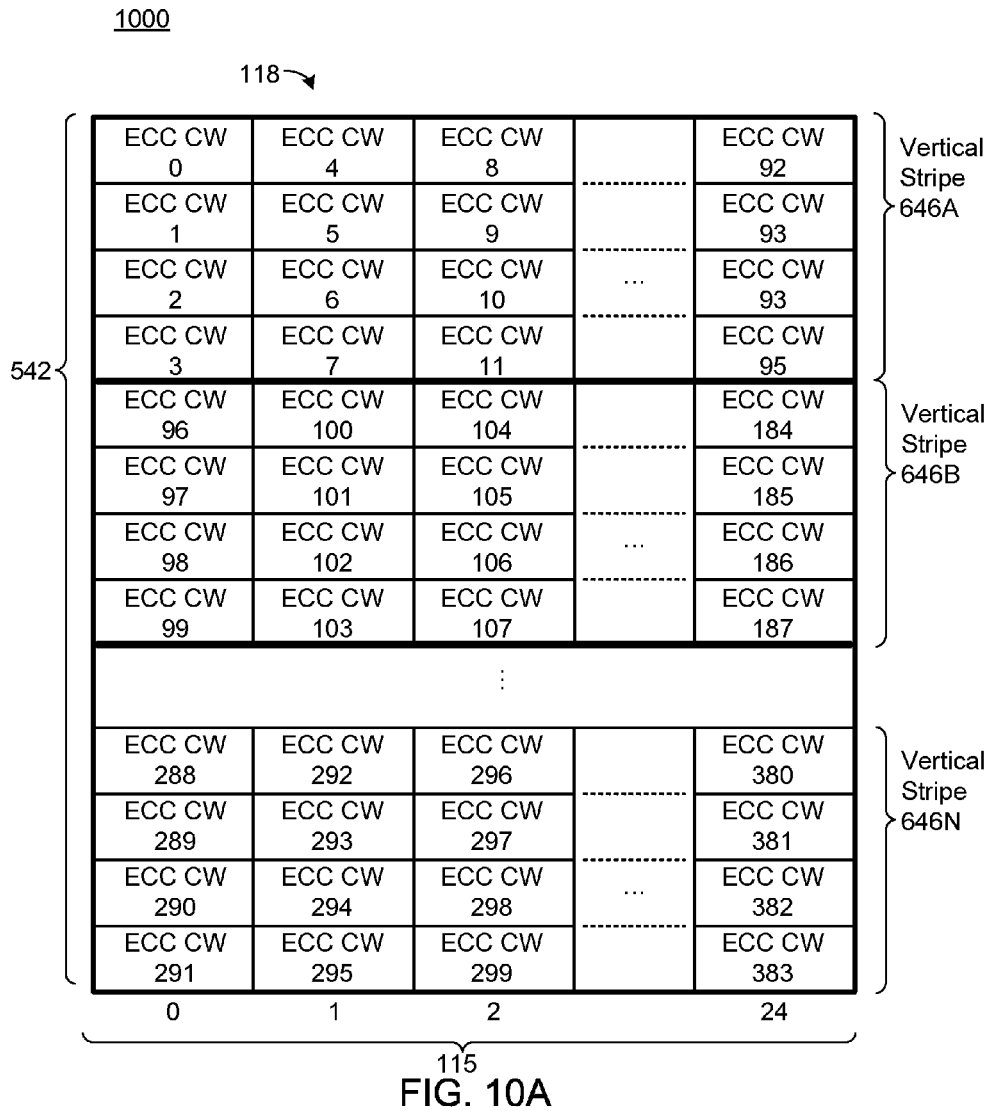
FIG. 10A is a block diagram of one embodiment of data stored in a vertical stripe configuration.

FIG. 10A depicts one embodiment of a vertical stripe data configuration 1000 within a logical page 542 (row 117) of a solid-state storage array 115. As disclosed above, a vertical stripe may comprise vertically arranged data structures within respective columns 118 of the array 115. The vertical stripes 646A-N have a configurable depth or length. In the FIG. 10A embodiment, the vertical stripes 646A-N are configured to have a depth sufficient to store four ECC codewords. In some embodiments, the depth of the vertical stripes 646A-N corresponds to an integral factor of ECC codeword size relative to a page size of the solid-state storage elements 116 comprising the array 115. The page size of the solid-state storage elements 116 may be 16 kb, each page may be configured to hold four vertical stripes 646A-N, and each vertical stripe may be configured to hold four 1 kb vertically aligned ECC codewords. The disclosed embodiments are not limited in this regard, however, and could be adapted to use any storage medium 140 having any page size in conjunction with any ECC codeword size and/or vertical stripe depth.

The depth of the vertical stripes 646A-N and the size of typical read operations may determine, inter alia, the number of channels (columns) needed to perform read operations (e.g., determine the number of channels used to perform a read operation, stream time Ts, and so on). For example, a 4 kb data packet may be contained within 5 ECC codewords, including ECC codewords 3 through 7. Reading the 4 kb packet from the array 115 may, therefore, comprise reading data from two columns (columns 0 and 1). A larger 8 kb data structure may span 10 ECC codewords (ECC codewords 98-107), and as such, reading the 8 kb data structure may comprise reading data from three columns of the array (columns 0, 1, and 2). Configuring the vertical stripes 646A-N with an increased depth may decrease the number of columns needed for a read operation, which may increase the stream time Ts for the individual read, but may allow for other independent read operations to be performed in parallel. Decreasing depth may increase the number of columns needed for read operations, which may decrease stream time $T_s$, but result in decreasing the number of other, independent read operations that can be performed in parallel.

Figure 10B:
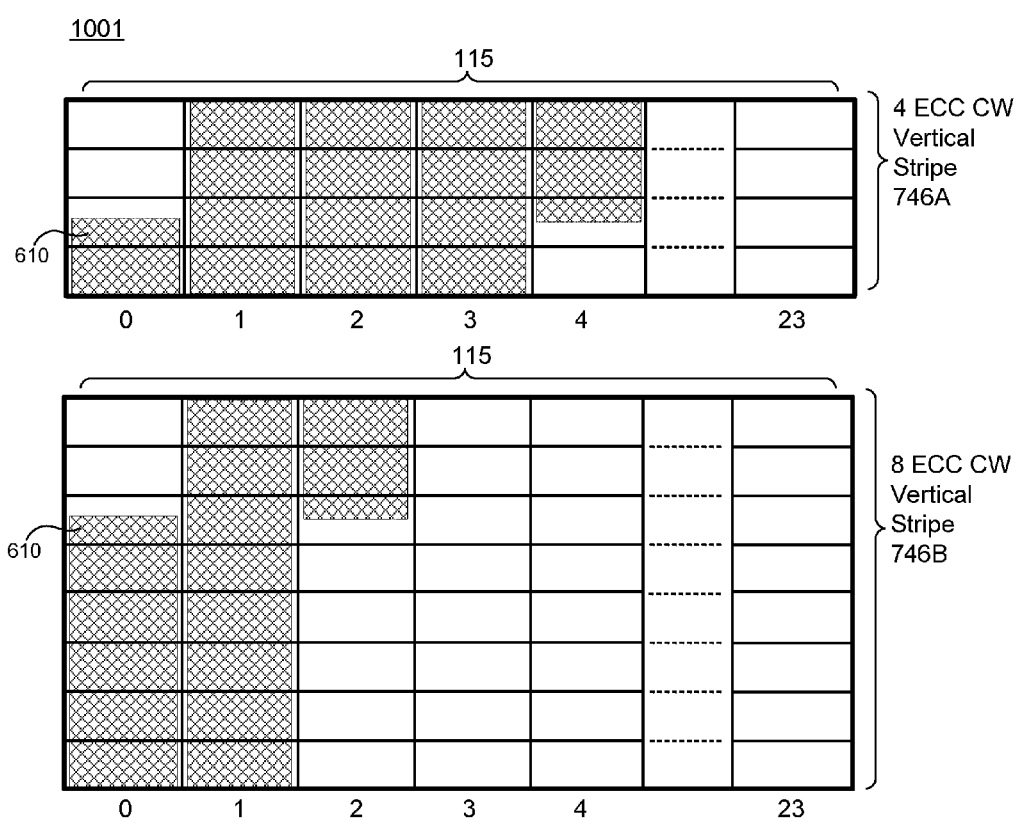
FIG. 10B is a block diagram of one embodiment of a system for referencing data stored in a vertical stripe configuration.

FIG. 10B depicts embodiments of vertical stripes 1001, each having a different respective depth. The vertical stripes 607 may comprise 1 kb, vertically aligned ECC codewords as disclosed above in conjunction with FIG. 8A-C. A 16 kb data structure 610 (packet) may be stored within a 4k deep vertical stripe 746A. The data structure 610 may be contained within 17 separate ECC codewords spanning five columns of the array 115 (columns 0 through 5). Accordingly, reading the data structure 610 may comprise reading data from an independent channel comprising six columns. The stream time Ts of the read operation may correspond to the depth of the vertical stripe 746A (e.g., the stream time of four ECC codewords).

The depth of the vertical stripe 746B may be increased to 8 kb, which may be sufficient to hold eight vertically aligned ECC codewords. The data structure 610 may be stored within 17 ECC codewords, as disclosed above. However, the modified depth of the vertical stripe 746B may result in the data structure occupying three columns (columns 0 through 2) rather than six. Accordingly, reading the data structure 610 may comprise reading data from an independent channel comprising three columns, which may increase the number of other, independent read operations that can occur in parallel on other columns (e.g., columns 3 and 4). The stream time Ts of the read operation may double as compared to the stream time of the vertical stripe 746A.

Figure 10C:
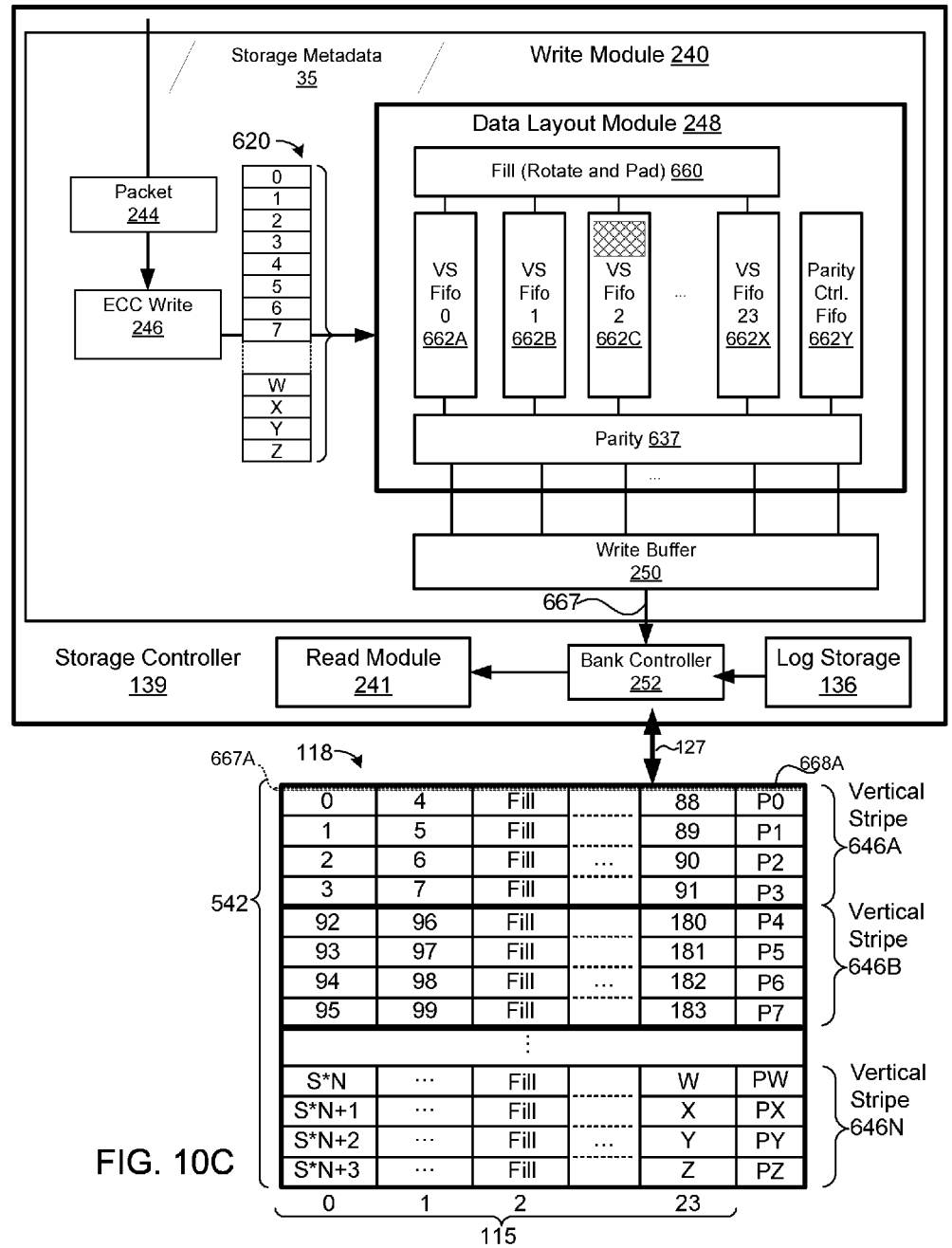
FIG. 10C is a block diagram of another embodiment of a system for referencing data stored in a vertical stripe configuration.

FIG. 10C is a block diagram of another embodiment of a system 1002 for referencing data on a storage medium. In the FIG. 10C embodiment, the data layout module 248 may be configured to store data in a vertical stripe configuration within logical pages 542 of the solid-state storage array 115. The write module 240 may comprise one or more processing modules, which as disclosed above, may include, but are not limited to a packet module 244 and an ECC write module 246. The ECC write module 246 may be configured to generate ECC codewords 620 (ECC codewords 0 through Z) in response to data for storage on the solid-state storage array 115, as disclosed above. The ECC codewords 620 may flow into the data layout module 248 serially via a 128 bit data path of the write module 240. As disclosed in further detail herein, the ECC write module 246 may further comprise a relational module 646 configured to include relational information in one or more of the ECC codewords 620.

The data layout module 248 may be configured to buffer the ECC codewords 620 for storage in vertical stripes, as disclosed herein. The data layout module 248 may comprise a fill module 660 that is configured to rotate the serial stream of ECC codewords 620 into vertical stripes by use of, inter alia, one or more cross point switches, FIFO buffers 662A-X, and the like. The FIFO buffers 662A-X may each correspond to a respective column of the array 115. The fill module 660 may be configured to rotate and/or buffer the ECC codewords 620 according to a particular vertical code word depth, which may be based on the ECC codeword 620 size and/or size of physical storage units of the array 115.

The data layout module 248 may be further configured to manage OOS conditions within the solid-state storage array 115. As disclosed above, an OOS condition may indicate that one or more columns 118 of the array are not currently in use to store data. The storage metadata 135 may identify columns 118 that are out of service within various portions of the solid-state storage array 115 (e.g., rows 117, logical erase blocks 540, or the like). In the FIG. 10C embodiment, the storage metadata 135 may indicate that column 2, of the current logical page 542, is out of service. In response, the fill module 660 may be configured to avoid column 2 by, inter alia, injecting padding data into the FIFO buffer of the OOS column (e.g., FIFO buffer 662C).

In some embodiments, the data layout module 248 may comprise a parity module 637 that is configured to generate parity data in accordance with the vertical strip data configuration. The parity data may be generated horizontally, on a byte-by-byte basis within rows 117 of the array 115 as disclosed above. The parity data P0 may correspond to ECC codewords 0, 4, through 88; the parity data P1 may correspond to ECC codewords 1, 5, through 89, and so on. The data layout module 248 may include a parity control FIFO 662Y configured to manage OOS conditions for parity calculations (e.g., ignore data within OOS columns for the purposes of the parity calculation).

The vertical stripe data configuration generated by the data layout module 248 (and parity module 637) may flow to write buffers of the solid-state storage elements 116A-Y within the array 115 through the write buffer and/or bank controller 252, as disclosed above. In some embodiments, data rows 667 generated by write module 240 may comprise one byte for each data column in the array 115 (columns 116A-X). Each byte in a data row 667 may correspond to a respective ECC codeword 620 and may include a corresponding parity byte. Accordingly, each data row 667 may comprise horizontal byte-wise parity information from which any of the bytes within the row 667 may be reconstructed, as disclosed herein. A data row 667A may comprise a byte of ECC codeword 0 for storage on column 0, a byte of ECC codeword 4 for storage on column 1, padding data for column 1, a byte of ECC codeword 88 for storage on column 23, and so on. The data row 667 may further comprise a parity byte 668A for storage on column 24 (or other column), as disclosed above.

The data may be programmed unto the solid-state storage array 115 as a plurality of vertical stripes 646A-N within a logical page 542, as disclosed above (e.g., by programming the contents of program buffers to physical storage units of the solid-state storage elements 116A-Y within the array 115). In the FIG. 10C embodiment, the indexing S*N may correspond to vertical stripes configured to hold S ECC codewords in an array 115 comprising N columns for storing data.

Figure 10D:
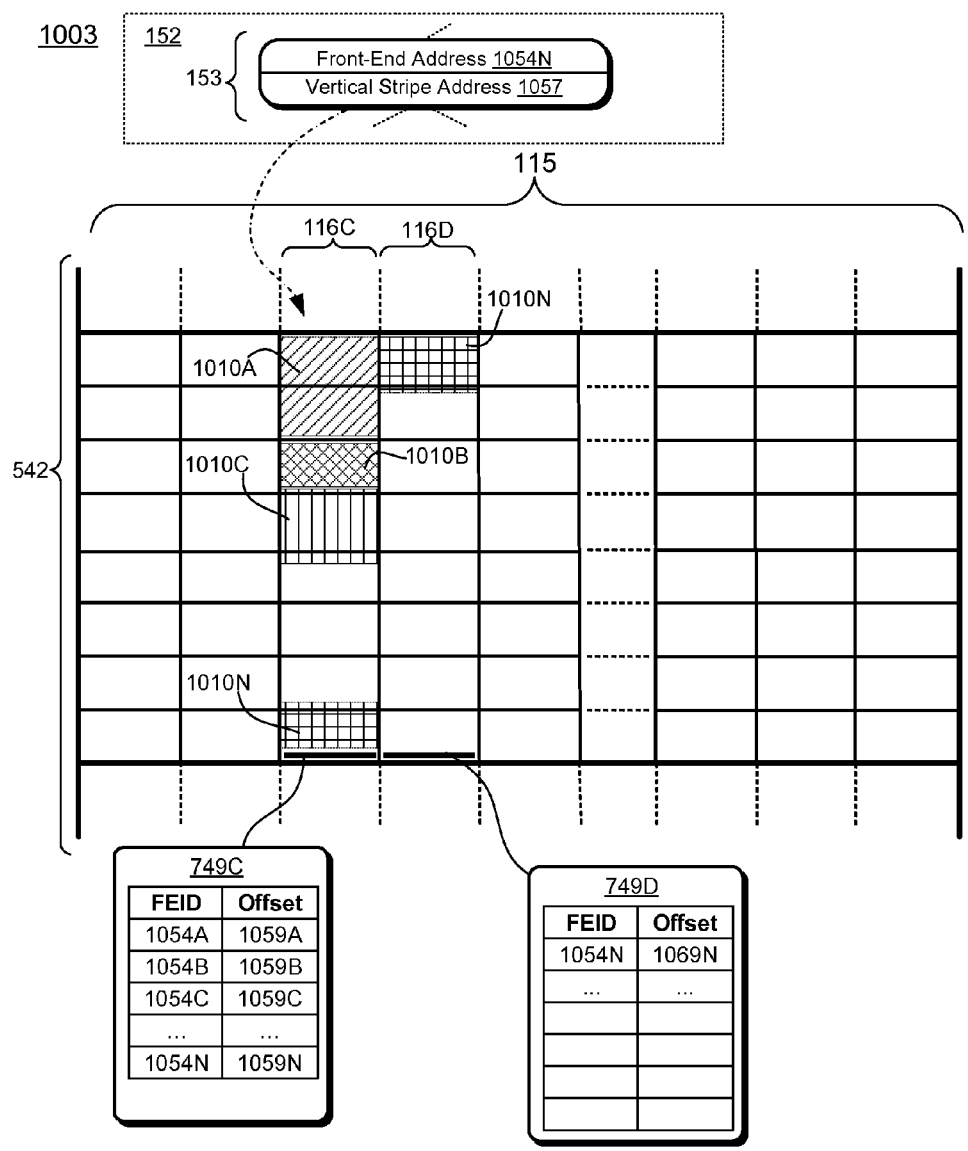
FIG. 10D is a block diagram of another embodiment of a system for referencing data stored in a vertical stripe configuration.

FIG. 10D depicts another embodiment of a system 1003 configured to reference data stored in a vertical stripe configuration on a solid state storage array. The offset index module 249 may be configured to segment the storage address of packets 1010A-N into a first portion corresponding to an address of the vertical stripe, which may correspond to a particular offset within a page of one or more storage elements (e.g., storage element 116C), and a second portion corresponding to offsets of the packets 1010A-N within the vertical stripe. The offset index module 249 may generate an offset index 749C configured for storage within the vertical stripe, as disclosed above. The offset index 749C may map front-end identifiers 1054A-N of the packets 1010A-N stored within the vertical stripe to respective offsets 1059A-N of the packets.

As disclosed above, packets may span vertical stripes. In the FIG. 10D embodiment, the packet 1010N is stored within vertical stripes on storage elements 116C and 116D. The offset index entry 1059N corresponding to the packet 1010N may indicate that the packet 1010N continues within the next stripe. The offset index 749D of the next vertical stripe may also include an entry associated with the front-end address 1054 of the packet 1010N and may indicate the offset and/or length of the remaining data of the packet 1010N within the column 116D. Accordingly, the offset index module 249 may be configured to link the offset index 749C to the offset index 749D. As illustrated in FIG. 10D, the forward map 152 may only include references to the vertical stripe on column 116C that comprises the "head" of the packet 1010N. Moreover, the translation module 134 may omit the second portion of the storage addresses (the offsets 1059A-N and 1069N) from the entries 153 to reduce the memory overhead of the forward map 152 and/or allow the forward map 152 to reference larger storage address spaces 144, as disclosed herein.

Figure 11:
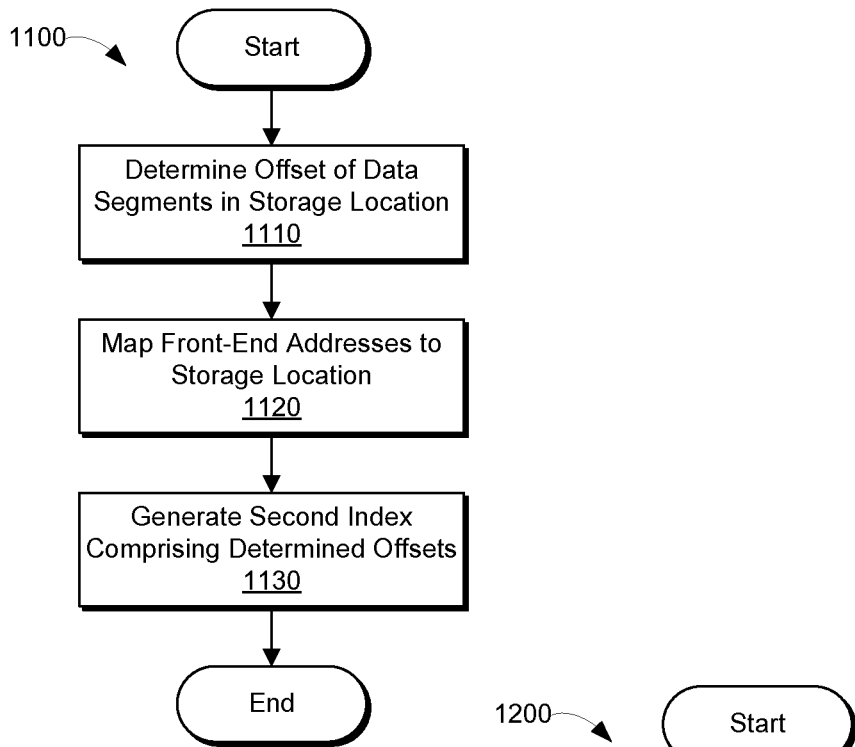
FIG. 11 is a flow diagram of one embodiment of a method for referencing data stored on a storage medium.

FIG. 11 is a flow diagram of one embodiment of a method 1100 for referencing data on a storage medium. Step 1110 may comprise arranging data segments for storage at respective offsets within a storage location of a storage medium 140. In some embodiments, step 1110 comprises formatting the data segments into one or more packets 610 and/or encoding the packets 610 into one or more ECC codewords 620, as disclosed herein. Step 1110 may further comprise streaming the packets 610 and/or ECC codewords 620 to program buffers of a solid-state storage array 115 via the interconnect 127. Step 1110 may further include generating parity data for each of a plurality of data rows 667 comprising the data segments, as disclosed herein.

In some embodiments, step 1110 may further comprise compressing one or more of the data segments such that a compressed size of the data segments differs from the original, uncompressed size of the data segments. Step 1110 may further include encrypting and/or whitening the data segments, as disclosed herein.

Step 1120 may comprise mapping front-end addresses of the data segments using, inter alia, a forward map 152, as disclosed herein. Step 1120 may comprise segmenting the storage addresses of the data segments into a first portion that addresses the storage location comprising the data segments (e.g., the physical address of the logical page 542 comprising the data segments), and second portions comprising the respective offsets of the data segments within the storage location. Step 1120 may further comprise indexing the front-end addresses to the first portion of the storage address, and omitting the second portion of the storage address from the entries 153 of the forward index 152. Step 1120 may comprise determining the data segment offsets based on a compressed size of the data segments, as disclosed herein. Accordingly, the offsets determined at step 1120 may differ from offsets based on the original, uncompressed size of the data segments.

Step 1130 may comprise generating an offset index for the storage location by use of the offset index module 249, as disclosed herein. Step 1130 may comprise generating an offset index 749 data structure that is configured for storage on the storage medium 140. The offset index 749 may be configured for storage at a predetermined offset and/or location within the storage location comprising the indexed data segments. The offset index 749 may be configured to map front-end addresses of the data segments stored within the storage location to respective offsets of the data segments within the storage location, as disclosed herein. In some embodiments, step 1130 further comprises storing the offset index 749 on the storage medium 140, which may comprise streaming the offset index 749 to program buffers of the storage elements 116A-Y comprising a solid-state storage array 115A-N and/or issuing a program command to the solid-state storage elements 116A-Y, as disclosed herein.

Figure 12:
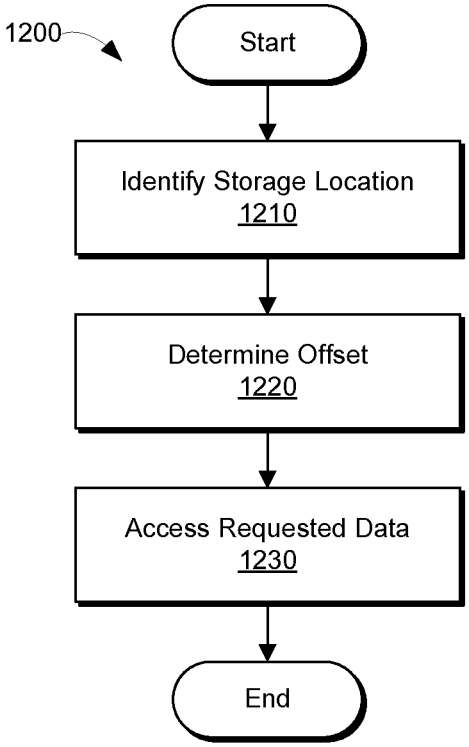
FIG. 12 is a flow diagram of another embodiment of a method for referencing data stored on a storage medium.

FIG. 12 is a flow diagram of another embodiment of a method 1200 for referencing data stored on a storage medium 140. Step 1210 may comprise identifying a storage location comprising data corresponding to a specified front-end address. Step 1210 may be implemented in response to a storage request pertaining to the front-end address. The storage request may include one or more of: a read request, a read-modify-write request, a copy request, and/or the like. Step 1210 may comprise accessing an entry 153 in the forward map 152 using, inter alia, the specified front-end address. The entry 153 may comprise the first portion of the full storage address of the requested data. The first portion may identify the storage location (e.g., logical page 542) comprising the requested data. The second portion of the full storage address may be maintained in a second index that is stored on the storage medium 140 and, as such, may be omitted from the forward map 152.

Step 1220 may comprise determining an offset of the requested data within the identified storage location. Step 1220 may comprise a) reading the identified storage location, b) accessing an offset index 749 at a predetermined location with the identified storage location, and c) determining the offset of data corresponding to the front-end address by use of the offset index. Accordingly, step 1220 may comprise forming the full storage address of the requested data by combining the address of the storage location maintained in the forward map 152 with the offset maintained in the on-media offset index 749.

Step 1230 may comprise accessing the requested data. Step 1230 may include streaming one or more ECC codewords 620 comprising the data packets 610 in which the requested data was stored from read buffers of the storage elements 116A-Y comprising a storage array 115A-N. Step 1230 may comprise streaming the data from the offset determined at step 1220. Step 1230 may further include processing the ECC codeword(s) 620 and/or packet(s) 610 comprising the requested data, as disclosed herein (e.g., by use of the ECC read module 247 and/or depacket module 245). Step 1230 may further comprise decompressing the requested data by use of the decompression module 243, decrypting the data, dewhitening the data, and so on, as disclosed herein.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD- ROMs, ROMs, RAMs, EPROMs, EEPROMs, magnetic or optical cards, solid-state memory devices, or other types of medium/machine-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the disclosure.

We claim:

1. A method, comprising:
arranging a plurality of data segments for storage at respective offsets within a storage unit of a solid-state storage medium;
mapping front-end addresses of the data segments to a physical address of the storage unit in a first index;
generating a second index for storage on the solid-state storage medium, wherein the second index is configured to associate front-end addresses of each of the plurality of data segments with respective offsets within the storage unit and wherein an entry of the second index includes a front-end address of a data segment of the plurality of data segments and indicates an offset of the data segment within the storage unit; and
accessing a requested data segment of the plurality of data segments, where accessing the requested data segment comprises:
performing a first translation comprising mapping a front-end address of the requested data segment to a physical address of the storage unit in the first index; and
performing a second translation comprising reading the second index stored at the physical address, and mapping the front-end address of the requested data segment to an offset of the requested data segment in the second index.

2. The method of claim 1, further comprising compressing one or more of the plurality of data segments for storage within the storage unit such that a compressed size of the compressed data segments differs from an uncompressed size of the data segments, wherein the offset of the data segment within the storage unit is based on the compressed size of the data segments.

3. The method of claim 1, further comprising storing the second index on the solid-state storage medium.

4. The method of claim 3, further comprising storing the second index on the storage unit comprising the plurality of data segments.

5. The method of claim 3, further comprising omitting the offset of the data segment from the first index.

6. The method of claim 1, wherein the data segment is associated with a particular front-end address, the method further comprising:
determining a storage address of the data segment by use of a storage unit address mapped to the particular front-end address in the first index and a data segment offset associated with the particular front-end address in the second index stored on the storage unit.

7. A non-transitory computer-readable storage medium comprising program instructions stored thereon, wherein the program instructions are executable by a computing system to cause the computing system to perform a method, comprising:
arranging a plurality of data segments for storage at respective offsets within a storage unit of a solid-state storage medium;
mapping front-end addresses of the data segments to a physical address of the storage unit in a first index;
generating a second index for storage on the solid-state storage medium, wherein the second index is configured to associate each of the plurality of data segments with a corresponding offset within the storage unit and wherein the second index is configured to associate the front-end address of the data segments with respective offsets of the data segments within the storage unit; and
accessing a requested data segment of the plurality of data segments by:
accessing a physical address of a storage unit mapped to the particular front-end address in the first index, and
reading the second index stored at the determined physical address to determine an offset of the requested data segment within the storage unit.

8. The non-transitory computer-readable storage medium of claim 7, wherein the method further comprises compressing one or more of the plurality of data segments for storage within the storage unit such that a compressed size of the compressed data segments differs from an uncompressed size of the data segments, wherein the offset of the data segment within the storage unit is based on the compressed size of the data segments.

9. The non-transitory computer-readable storage medium of claim 7, wherein the method further comprises storing the second index on the solid-state storage medium.

10. The non-transitory computer-readable storage medium of claim 9, wherein the method further comprises storing the second index on the storage unit comprising the plurality of data segments.

11. The non-transitory computer-readable storage medium of claim 9, wherein the method further comprises omitting the offset of the data segment from the first index.

12. The non-transitory computer-readable storage medium of claim 7, wherein the data segment is associated with a particular front-end address, and wherein the method further comprises determining a storage address of a data segment by:

mapping the particular front-end address to a storage unit address in the first index; and determining the offset of the data segment by mapping the particular front-end address to an entry of the second index stored at the storage unit address.

* * * * *